(12) United States Patent  (10) Patent No.: US 7,782,707 B2
Nishikawa et al.  (45) Date of Patent: Aug. 24, 2010

(54) SEMICONDUCTOR MEMORY DEVICE

(75) Inventors: Kazuyo Nishikawa, Osaka (JP);
Masahiro Ueminami, Kyoto (JP);
Tadashi Nitta, Kyoto (JP)

(73) Assignee: Panasonic Corporation, Osaka (JP)

( * ) Notice: Subject to any disclaimer, the term of this patent is extended or adjusted under 35 U.S.C. 154(b) by 392 days.

(21) Appl. No.: 11/917,821

(22) PCT Filed: Mar. 30, 2007

(86) PCT No.: PCT/JP2007/057139
§ 371 (c)(1),
(2), (4) Date: Dec. 17, 2007

(87) PCT Pub. No.: WO2007/116827
PCT Pub. Date: Oct. 18, 2007

(65) Prior Publication Data
US 2009/0080269 A1  Mar. 26, 2009

(30) Foreign Application Priority Data
Mar. 30, 2006 (JP) .............................. 2006-094027

(51) Int. Cl.
*G11C 8/00* (2006.01)
(52) U.S. Cl. .............................. 365/233.12; 365/233.13
(58) Field of Classification Search ............ 365/233.12, 365/233.13, 233.17; 711/167, 105
See application file for complete search history.

(56) References Cited

U.S. PATENT DOCUMENTS

| 5,748,560 | A | 5/1998 | Sawada |
| 5,917,768 | A | 6/1999 | Pascucci |
| 6,643,215 | B2 | 11/2003 | Kwak |
| 6,789,209 | B1 | 9/2004 | Suzuki et al. |
| 6,917,994 | B2 * | 7/2005 | Maone et al. ............... 710/105 |
| 2004/0064661 | A1 * | 4/2004 | Sheffield et al. ............ 711/167 |

FOREIGN PATENT DOCUMENTS

| JP | 02-014490 | 1/1990 |
| JP | 06-295258 | 10/1994 |
| JP | 2001-110183 | 4/2001 |

OTHER PUBLICATIONS

"Data Sheet—512 M bits DDR SDRAM", Document No. E0699e50 (Ver. 5.0), Nov. 2006, Elpida Memory, Inc., Japan.
"Fujitsu semiconductor device Data Sheet DS05-11429-2 (Memory Mobile FCRAM MB82DBS02163C)", 2005, Fujitsu, LTD. (In Japanese with partial English Translation).

* cited by examiner

*Primary Examiner*—Vu A Le
(74) *Attorney, Agent, or Firm*—McDermott Will & Emery LLP

(57) ABSTRACT

A semiconductor memory device comprises an address terminal through which an address for reading out stored data in a memory array is input, a clock input terminal through which an input clock is input, a data output terminal through which data read out from the memory array in accordance with the address is output, and a clock output terminal through which an output clock synchronous with the input clock is output. The clock output terminal invariably outputs one of a first voltage and a second voltage. Only when valid data is output from the data output terminal, the clock output terminal causes an output voltage to go from the first voltage to the second voltage or from one voltage to the other voltage.

13 Claims, 20 Drawing Sheets

SEMICONDUCTOR MEMORY DEVICE

RELATED APPLICATIONS

This application is the U.S. National Phase under 35 U.S.C. §371 of International Application No. PCT/JP2007/057139, filed on Mar. 30, 2007, which in turn claims the benefit of Japanese Application No. 2006-094027, filed on Mar. 30, 2006, the disclosures of which Applications are incorporated by reference herein.

TECHNICAL FIELD

The present invention relates to, for example, a clock-synchronization type Semiconductor memory device, an imtegrated circuit comprising this, and a system (semiconductor device) employing this, a stored data reading device, and the like.

BACKGROUND ART

As a conventional clock-synchronization type semiconductor memory device, for example, an FCRAM (registered trademark), which is an asynchronous SRAM type fast access memory having a burst read mode, has come into practical use for mobile telephones which are recently in increasing demand.

The FCRAM, when it is set in the burst read mode, operates in synchronization with a clock signal externally input. The FCRAM outputs data when a number of clock pulses corresponding to a previously set latency have been input since input of an address.

In a continuous burst read mode in which a batch read data length is not specified, when a read address reaches a row address boundary of a memory array during continuous read, data output delay occurs. In order to notify the outside of this output delay, a data bus state signal indicating whether a data bus is valid or invalid is output from the FCRAM. A host apparatus can prevent erroneous read of invalid data by performing data read when the data bus state signal is at a level indicating "valid" (see, for example, Non-Patent Document 1).

FIG. 20 is a timing chart of a conventional clock-synchronization type semiconductor memory device, showing transition timings of an external input clock signal, an output data signal, a data bus state signal, and the like during burst read. In FIG. 20, /CE indicates a chip enable signal, ADD indicates an external input address signal, a CLK indicates an external input clock signal, a DQ indicates an output data signal, and /WAIT indicates a data bus state signal. Note that, in FIG. 20, it is assumed that the latency=4. Also, in FIG. 20 and the following description, numerals added to "CLK" indicate clock numbers which are counted after the start of a read operation.

In FIG. 20, a read address is input by ADD with respect to the rise of CLK1 after a predetermined setup time. Thereafter, CLK2 to CLK4 corresponding to a set clock number which is the latency−1 (i.e., 4−1=3 clocks) are input before DQ is output with CLK5. A /WAIT signal goes from an "L (Low)" level indicating that the data bus is invalid to a "H (High)" level indicating that the data bus is valid, with CLK4 which is one clock before the DQ is output.

It is assumed that, when four pieces of data have read out, a read address reaches a row address boundary of a memory array. In this case, four clocks after the /WAIT signal goes to "H", the /WAIT signal goes to the "L" level indicating that the data bus is invalid. The following data is output after the /WAIT signal goes to the "H" level again.

Thus, when valid data is output, the /WAIT signal is caused to go to "H", while when data is invalid, the /WAIT signal is caused to go to "L". Thereby, the host apparatus is prevented from reading out erroneous data.

Also, a DDR SDRAM has come into practical use which is a memory for a high-speed system and outputs data at both edges of a clock. This DDR SDRAM is provided with a DQS (data strobe) terminal so as to achieve high speed, thereby avoiding an error in data reception.

In this memory, during write, a host apparatus outputs DQS and data synchronous with the DQS, while the memory takes in write data using the DQS.

During read, the memory outputs DQS and data synchronous with the DQS, while a host apparatus takes in read data using the DQS. The timing of outputting read data is determined, depending on a previously set latency. The DQS goes from HiZ (high-impedance state) to the "L" level, as preamble, one cycle before data is output. During the next cycle, the DQS goes to the "H" level, so that data output is started (e.g., Elpida Memory, Inc., "512M bits DDR SDRAM DATA SHEET", Document No. E0699E50 (Ver. 5.0), November 2006, p. 27).

Non-Patent Document 1: FUJITSU, Ltd., "FUJITSU semiconductor device DATA SHEET DS05-11429-2 (Memory Mobile FCRAM MB82DBS02163C)", 2005

DISCLOSURE OF THE INVENTION

Problems to be Solved by the Invention

In conventional techniques, however, since data is output in accordance with a previously set latency, even when data read from a memory array has been early completed, data is not externally output. Specifically, for example, in the example of FIG. 20, even if data read from a memory array has already been completed before the fall of CLK3, data output is performed at the fall of CLK4 which is one clock cycle after CLK3. The latency needs to be set, depending on the maximum of a read time varying depending on temperature and voltage conditions during use of the semiconductor memory device and conditions during manufacture of the semiconductor memory device.

Therefore, the read speed of the semiconductor memory device cannot be necessarily effectively used, so that it is difficult to improve system performance.

On the other hand, in order to improve system performance, for example, when a clock cycle is changed during an operation, a host apparatus needs to perform a control to change the latency, depending on the clock cycle or the like, as described in Non-Patent Document 1 (P. 20).

Also, even if a data bus state signal (/WAIT) is used to notify that data is invalid as shown in FIG. 20, then when a signal delay of, for example, a ½ cycle (thCLK in FIG. 20) (or more) of CLK occurs between the host apparatus and the clock-synchronization type semiconductor memory device, the output data signal DQ and the data bus state signal /WAIT become DQ1 and /WAIT1, respectively, as shown in FIG. 20. In such a case, a CPU may perform erroneous read due to insufficient setup when data is taken in with CLK, or deviation of a read start cycle caused by a gap between CLK and monitoring timing of the data bus state signal. In order to prevent such erroneous read, the host apparatus needs to perform a complicated clock control. Also, as the clock frequency is increased, it becomes more difficult to prevent the erroneous read.

When the data bus state signal is caused to go to "L" by detecting only that a read address reaches a row address boundary, the data bus state signal does not go to "L" even if read is delayed due to various factors, such as a voltage variation during read and the like. In this case, although the data bus is invalid, inappropriate data may be taken in.

In an arrangement in which, when data output is started, the DQS (data strobe) signal goes from the high-impedance state to the "L" level (preamble is required), a host apparatus which receives data detects the transition to the "L" level and waits for the next DQS clock, which requires a complicated control.

In view of the problems described above, the present invention is achieved. An object of the present invention is to enable to easily read out data with earliest timing, and easily prevent erroneous read even when output data is delayed by a clock cycle or more, when a read time (suddenly) changes due to various factors, or the like, without a complicated control of a host apparatus.

Solution to the Problems

A semiconductor memory device of the present invention comprises:
an address terminal through which an address for reading out stored data in a memory array is input;
a clock input terminal through which an input clock is input;
a data output terminal through which data read out from the memory array in accordance with the address is output; and
a clock output terminal through which an output clock synchronous with the input clock is output,
wherein the clock output terminal invariably outputs one of a first voltage and a second voltage, and
only when valid data is output from the data output terminal, the clock output terminal causes an output voltage to go from the first voltage to the second voltage or from one voltage to the other voltage.

Also, for example, transition of the output voltage at the clock output terminal is performed with timing which depends on a time from the start to the end of read of data from the memory array and does not depend on an input clock number counted from the start of the read.

Thereby, a stored data reading device can easily take in data read out from the semiconductor memory device based on the output clock in high reliability.

Also, quick read can be easily achieved by causing transition of an output voltage at the clock terminal as described above.

EFFECT OF THE INVENTION

According to the present invention, data can be easily read out with earliest timing, and erroneous read can be easily prevented.

Figure 1:
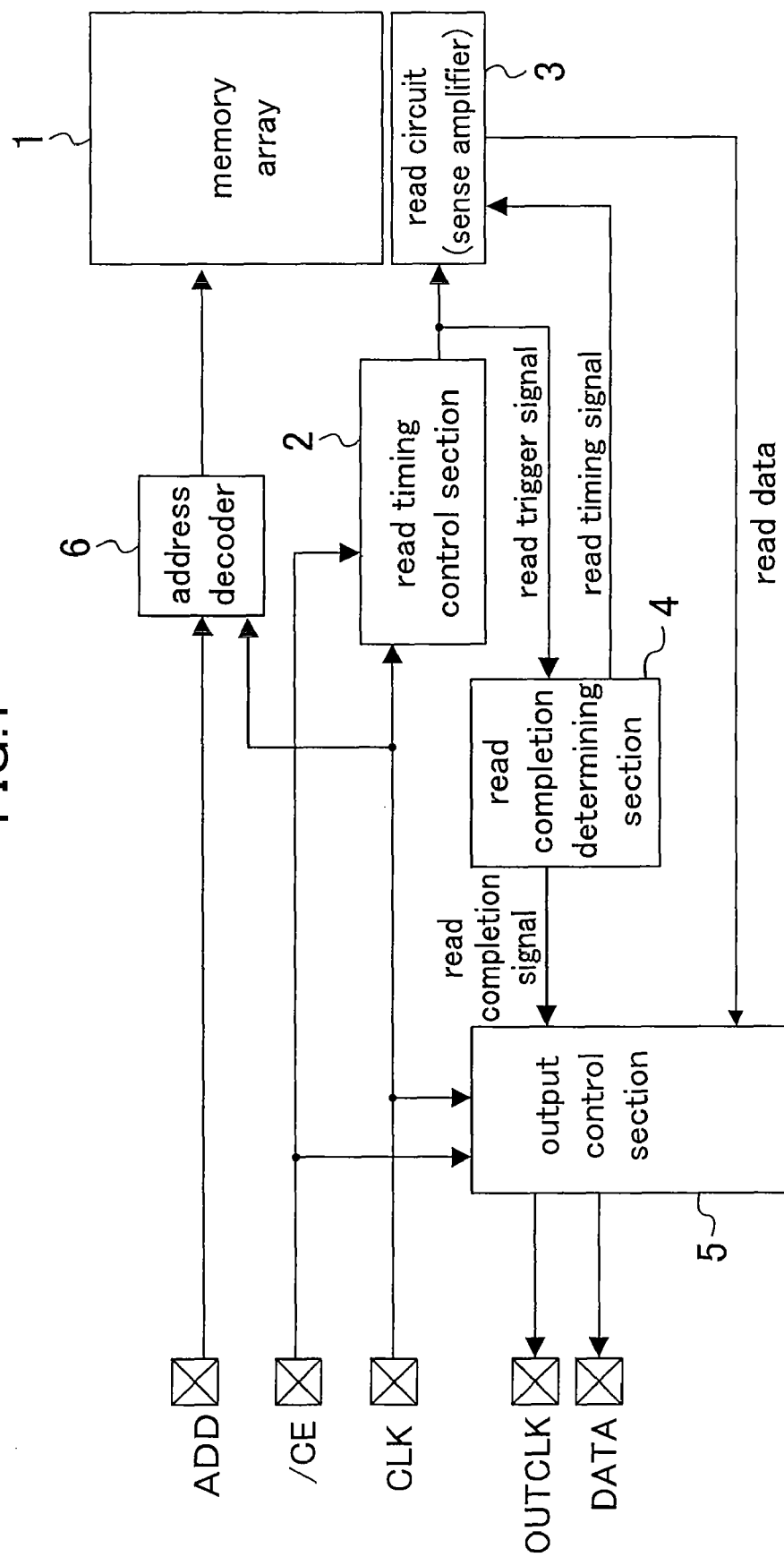
FIG. 1 is a block diagram showing a configuration of a semiconductor memory device according to Embodiment 1.

DESCRIPTION OF THE REFERENCE CHARACTERS 1 memory array
2 read timing control section
3 read circuit
4 read completion determining section
5 output control section
6 address decoder
7 address control section
10 read data latch
11 output bit counter
12 output bit selecting circuit
13 output synchronizing circuit
14 OUTCLK generating section
15 AND circuit
16 flip-flop circuit
20 latch selecting circuit
21 read data latch L
22 read data latch H
23 read completion counter
24 OUTCLK generating section
25 AND circuit
32 output bit selecting circuit
42 read timing control section
44 read completion determining section
62 read timing control section
65 output control section
84 OUTCLK generating section 85 output control section
105 output control section
113 read circuit
114 read completion determining section
160 host apparatus
161 memory
162 memory data read control section
163 memory data take-in control section
164 CPU
165 output control section
171 OUTCLK counter
172 memory data latch
173 memory data latch
174 comparator

BEST MODE FOR CARRYING OUT THE INVENTION

Hereinafter, embodiments of the present invention will be described in detail with reference to the accompanying drawings. Note that like parts are indicated by like reference numerals and will not be repeatedly described.

Embodiment 1 of the Invention

FIG. 1 is a block diagram showing a configuration of a major portion of a semiconductor memory device according to Embodiment 1.

This semiconductor memory device comprises a memory array 1, a read timing control section 2, a read circuit 3, a read completion determining section 4, an output control section 5, and an address decoder 6. Although, in addition to the parts described above, the semiconductor memory device further comprises various circuits required for a memory device, such as a power supply circuit for supplying a bias voltage required for an operation of each part, a circuit for writing data when data write is possible, and the like, parts required for description of this embodiment will be mainly described.

The memory array 1 includes an array of a plurality of memory cells for storing data.

The read timing control section 2 generates a read trigger signal indicating timing of starting a read operation of stored data in synchronization with an input clock externally input.

The read circuit 3, which has a sense amplifier (not shown), starts a read operation of stored data in response to transition to "H (High level)" of the read trigger signal output from the read timing control section 2, holds data read out from a memory cell in response to transition to "L (Low level)" of a read timing signal output from the read completion determining section 4, and outputs the data as read data.

The read completion determining section 4, after the read trigger signal goes to "H", outputs a read timing signal which is at "H" during a period TRAC described below, and a read completion signal which is at "L" during a period TRAC+TDLY. Here, the above-described timing control is performed using, for example, a clock which is oscillated in the semiconductor memory device and whose cycle is shorter than that of an input clock. Note that the present invention is not limited to this, and the timing control may be performed using an analog delay circuit or the like. The period TRAC or the like may be set during design or may be set, depending on characteristics or the like of the semiconductor memory device, when it is manufactured or is incorporated into an apparatus. Alternatively, the period TRAC or the like may be dynamically set, depending on a power supply voltage, temperature, or the like, by an initialization process upon start of use or during use, after being incorporated into an apparatus.

The output control section 5 outputs the read data output from the read circuit 3 as output data DATA, and outputs an output clock OUTCLK indicating timing with which a host apparatus (not shown) takes in the read data.

The address decoder 6 decodes a read address externally input, and outputs a selection signal for selecting a specific memory cell in the memory array 1.

Here, in FIG. 1, a terminal ADD is an address input terminal through which a read address is input.

A terminal /CE is a chip enable signal input terminal through which a chip enable signal which goes to the "L" level when stored data is read is input.

A terminal CLK is an input clock input terminal through which an input clock is input.

A terminal OUTCLK is an output clock output terminal through which an output clock is output.

A terminal DATA is a data output terminal through which output data DATA is output.

Note that, in the following description, the symbols indicating the terminals are also used to indicate corresponding signals as appropriate for the sake of convenience. Also, in the following description and the drawings, numerals added to "CLK" indicate clock numbers which are counted after /CE goes to "L".

Figure 2:
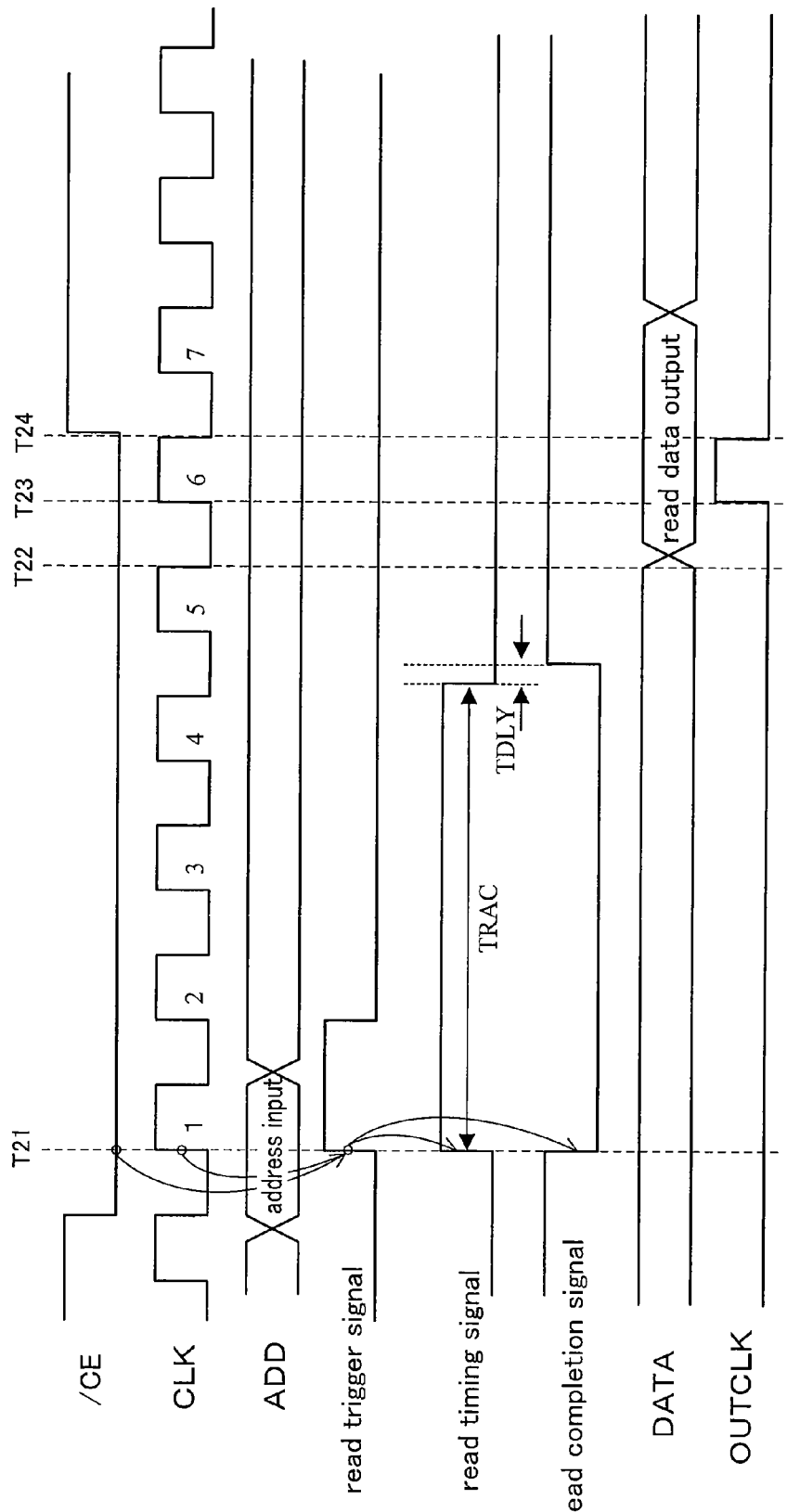
FIG. 2 is a timing chart showing an operation of each part of the semiconductor memory device of Embodiment 1.

An operation of the thus-configured semiconductor memory device will be described. FIG. 2 is a timing chart showing a signal of each part of the semiconductor memory device.

When an read address ADD is input, the address is taken in and decoded by the address decoder 6 at the rise of CLK1 (T21), and a selection signal of a memory cell corresponding to the address is output to the memory array 1.

Also, if the chip enable signal /CE goes to "L" when the read address ADD is input, the read timing control section 2 causes the read trigger signal to go to "H" in synchronization with the rise (T21) of CLK1 and maintain at "H", only once, for a predetermined time (e.g., a time until the rise of the next CLK2).

The read circuit 3 is activated in accordance with the read trigger signal (a read sequence, such as precharge or the like, is started).

The read completion determining section 4, when the read trigger signal goes to "H" (T21), causes the read timing signal to go to "H", and after lapse of the previously set period TRAC, go to "L". The period TRAC is a period which is set, depending on a time required for the read circuit 3 to read stored data.

The read circuit 3, when the read timing signal goes to "L", is inactivated (the read sequence is ended), holds data read out from the memory array 1, and outputs the data as read data.

The read completion determining section 4, when the read trigger signal goes to "H" (T21), causes the read completion signal to go to "L", and after lapse of the period TRAC+TDLY, go to "H". The TDLY is a period which is determined, depending on a time required for the read data output from the read circuit 3 to propagate to the output control section 5 (note that, for example, when TDLY is negligible, only the period TRAC may be set).

The output control section 5 takes in the read data output from the read circuit 3 and outputs the data as output data DATA to the DATA output terminal, at the fall (T22) of first CLK5 after the read completion signal goes to "H". The output control section 5 also outputs an output clock OUT-CLK (one clock) to the OUTCLK terminal in synchronization with the rise (T23) of the next CLK6.

Thereafter, when the chip enable signal /CE goes to "H", the semiconductor memory device goes to the disabled state, and the output clock OUTCLK is no longer output from the output control section 5.

Figure 3:
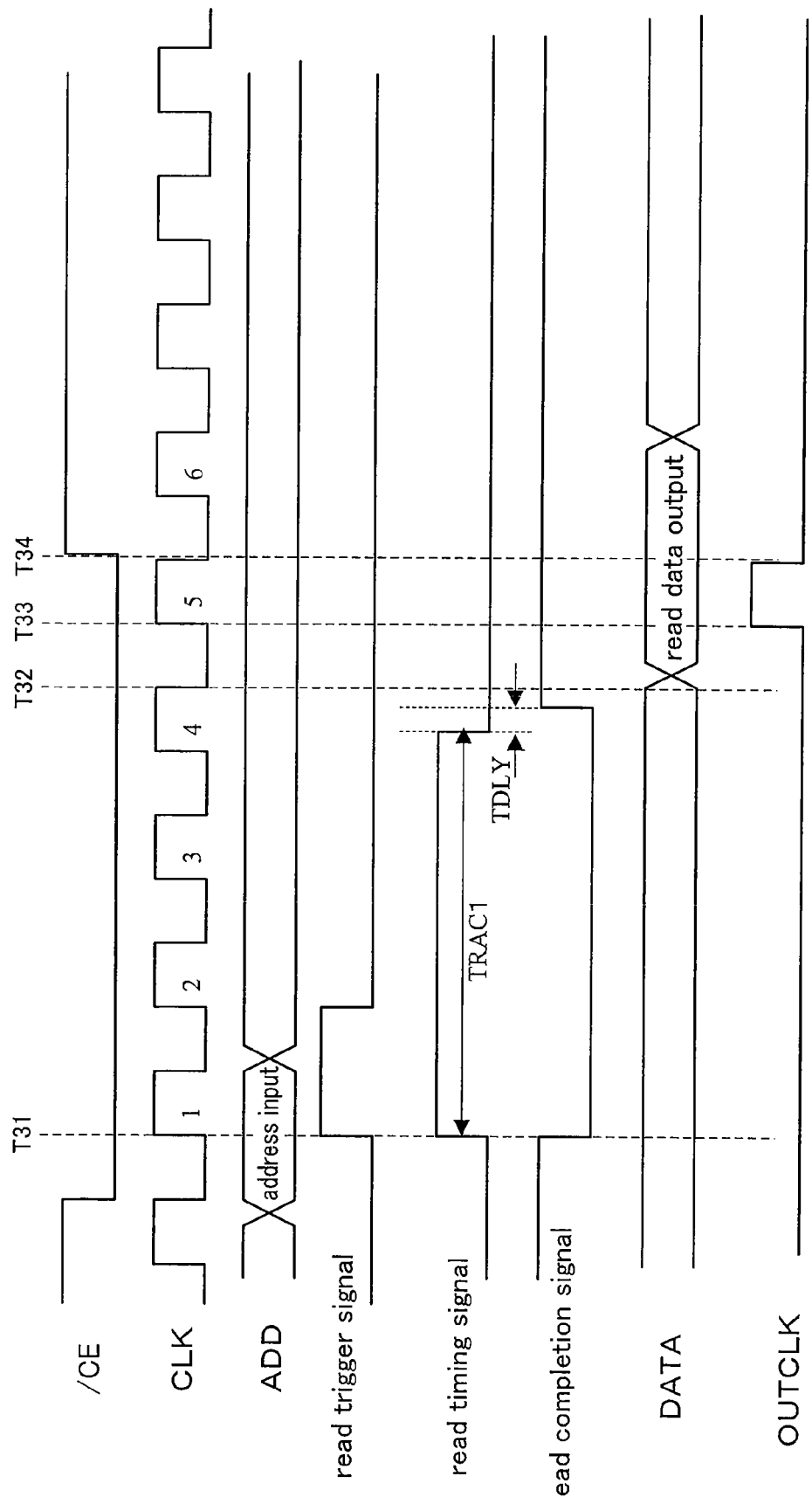
FIG. 3 is a timing chart showing another operation of each part.

As described above, for example, the output timing of the output data DATA can be flexibly controlled by setting the period TRAC or the like, depending on, for example, a time required for the read circuit 3 to read stored data, which varies depending on conditions during manufacture of the semiconductor memory device, conditions (voltage, temperature, etc.) during an operation, or the like. Specifically, for example, as is different from the example of FIG. 2 in which the output data DATA and the output clock OUTCLK are output with a sixth clock CLK6 counted from CLK1, the period TRAC is reduced (TRAC1) so that the output data DATA and the output clock OUTCLK are output with a fifth clock CLK5 as shown in FIG. 3. In other words, stored data can be easily read out with the earliest timing. It is also possible to easily prevent erroneous read or the like.

Even when the frequency of the input clock is changed, timing is similarly controlled using the period TRAC or the like, so that the latency does not need to be changed, depending on the clock frequency. Therefore, the clock frequency can be easily changed.

In addition, a host apparatus only needs to take in the output data DATA using the output clock OUTCLK, and does not need to perform a control to get ready to read, such as detection of timing with which output data is output from a memory based on a strobe signal, or the like.

Although it has been assumed in the above-described example that the read data is output via the output control section 5, the read data may be output directly from the read circuit 3, and the output control section 5 may mainly output only the output clock OUTCLK.

Embodiment 2 of the Invention

As a semiconductor memory device according to Embodiment 2, an exemplary semiconductor memory device will be described in which stored data at successive read addresses, where an input read address ADD is an initial value, is output during a time when the chip enable signal /CE is "L".

Figure 4:
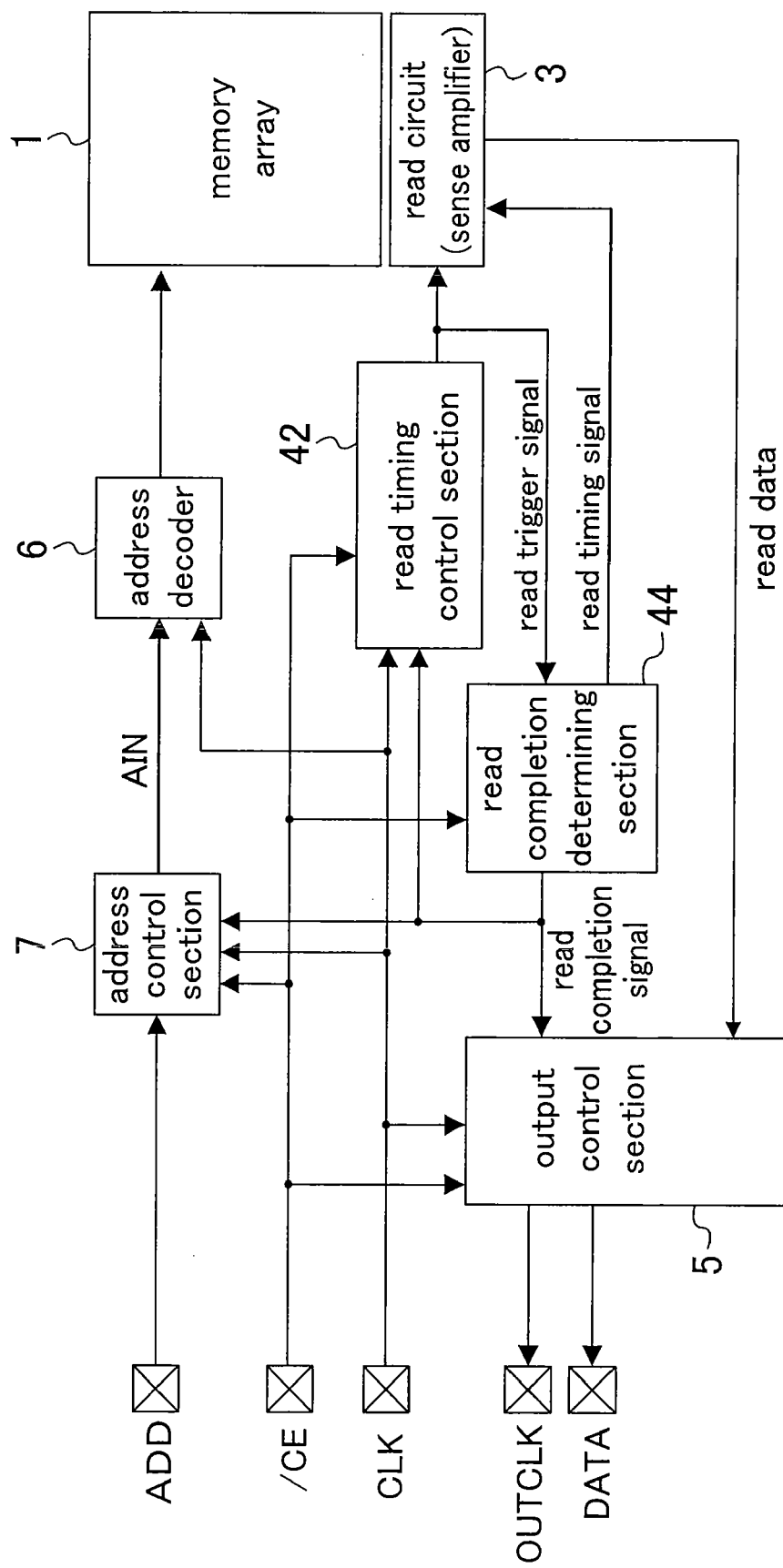
FIG. 4 is a block diagram showing a configuration of a semiconductor memory device according to Embodiment 2.

As shown in FIG. 4, this semiconductor memory device has a configuration different from that of the semiconductor memory device of Embodiment 1 in that a read timing control section 42 and a read completion determining section 44 are provided instead of the read timing control section 2 and the read completion determining section 4. This semiconductor memory device further comprises an address control section 7.

The read timing control section 42 receives a read completion signal from the read completion determining section 44 in addition to /CE and CLK, and repeatedly outputs a read trigger signal every time read of stored data is completed, during a time when /CE is at "L".

The read completion determining section 44 repeatedly performs an operation similar to that of the read completion determining section 4 of Embodiment 1 every time the read trigger signal is output, and stops the operation when /CE goes to "H".

The address control section 7 has an automatic address increment function to successively output successive read addresses. More specifically, a read address ADD externally input is set as an initial value, and incremented read addresses AIN, AIN+1, AIN+2, ... are output every time the read completion signal output from the read completion determining section 44 goes to "H".

In the thus-configured semiconductor memory device, a read operation for each address is almost similar to that of Embodiment 1, however, a plurality of addresses are successively read as described below. Hereinafter, a description will be given with reference to FIG. 5.

Initially, the address control section 7, when /CE goes from "H" to "L", takes in an externally input read address ADD in synchronization with the fall of CLK, and outputs the read address ADD as it is, as a read address AIN. Note that, thereafter, during a time when /CE is at "L", successively incremented read addresses AIN, AIN+1, ... are output every time CLK falls after the read completion signal goes to "H" as described below.

The read timing control section 42 causes the read trigger signal to be at "H" for a predetermined period from rise (T51) after the first fall of CLK after both conditions that /CE is at "L" and that the read completion signal is at "H", are satisfied.

In this case, a read operation from the memory array 1 is performed as in Embodiment 1. After the period TRAC+TDLY has passed since the read trigger signal went to "H", the read completion signal goes to "H". The output control section 5 outputs DATA0 as the output data DATA at the fall (T52) of the subsequent first CLK4, and further outputs an output clock OUTCLK (one clock) in synchronization with the rise (T53) of the next CLK5.

At the above-described (T52), the address control section 7 increments the read address to AIN+1 when CLK4 falls after the read completion signal goes to "H" as described above.

On the other hand, at the above-described (T53), as is similar to (T51), CLK rises after CLK first falls after the conditions that /CE is at "L" and that the read completion signal is at "H" are satisfied, so that the read timing control section 42 causes the read trigger signal to be at "H" for a predetermined period again. Therefore, a read operation is performed again in a manner similar to that as described above with respect to stored data at the read address AIN+1. Specifically, the read circuit 3 starts a read sequence, and the read completion determining section 44 causes the read timing signal to be at "H" for the period TRAC from the above-described (T51), and causes the read completion signal to be at "L" for the period TRAC+TDLY. Thereby, the next output data DATA1 is output from the output control section 5 at (T54).

Figure 5:
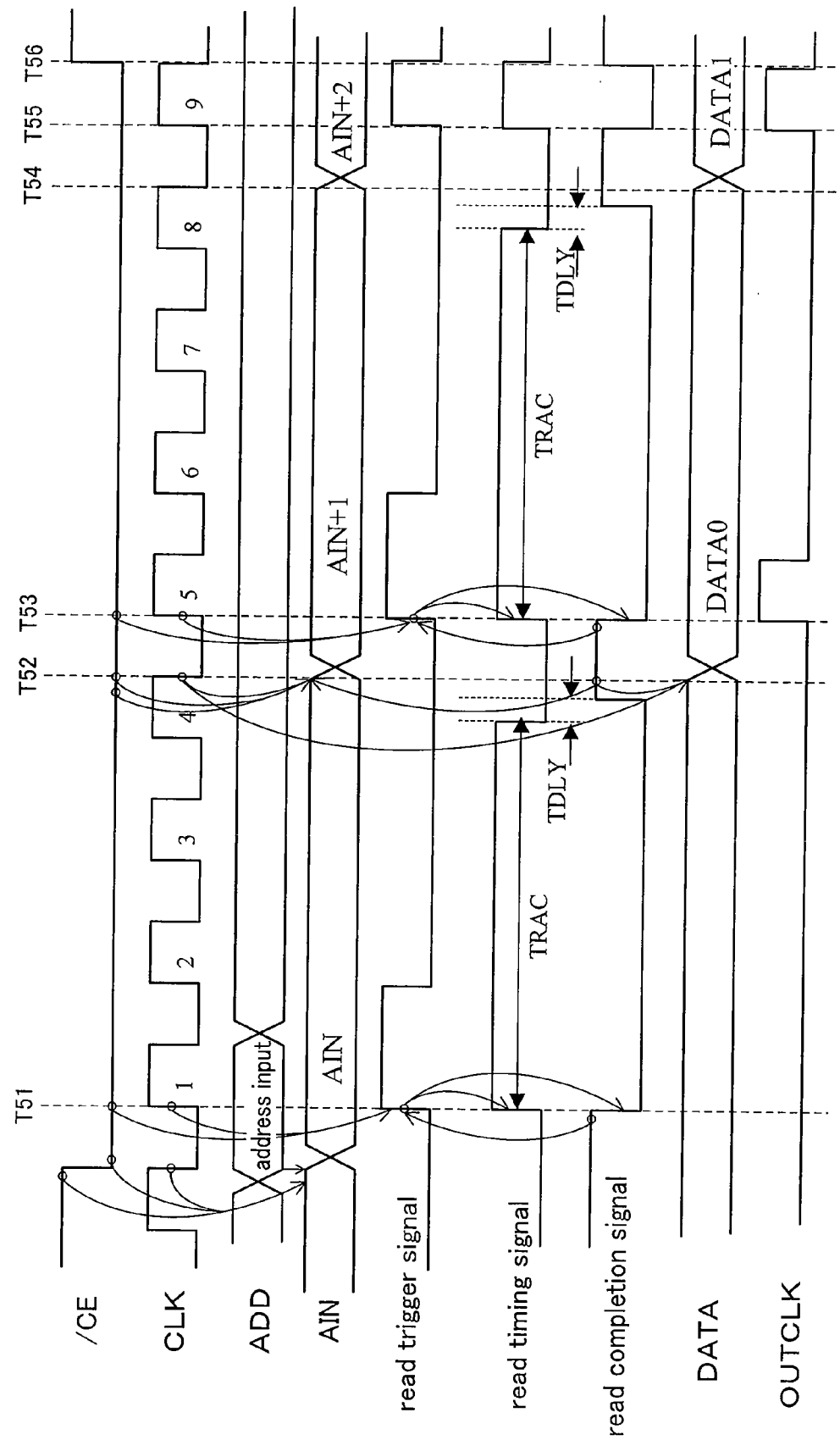
FIG. 5 is a timing chart showing an operation of each part of the semiconductor memory device of Embodiment 2.

Hereinafter, further, the next read operation is similarly performed. In the example of FIG. 5, however, when /CE goes to "H" at (T56), the read operation being executed is aborted. Specifically, the read timing control section 42 causes the read trigger signal to return to "L", the read completion determining section 44 causes the read timing signal and the read completion signal to return to "L" and "H", respectively, the output control section 5 stops outputting of the subsequent output data DATA and the like, and the output control section 5 suppresses outputting of the subsequent output clock OUTCLK.

As described above, every time the read completion signal goes to "H", the address control section 7 increments the read address, and the read trigger signal goes to "H", so that the next read operation is performed. Thereby, only by inputting a head address, a successive read operation can be performed.

Embodiment 3 of the Invention

As a semiconductor memory device according to Embodiment 3, an exemplary semiconductor memory device in which the bit width of data output through the DATA terminal is smaller than the data bit width of data read out from a read circuit will be described. In this exemplary semiconductor memory device, 32-bit data read out from the read circuit is divided into four pieces 8-bit data, which are in turn separately output through the DATA terminal.

Figure 6:
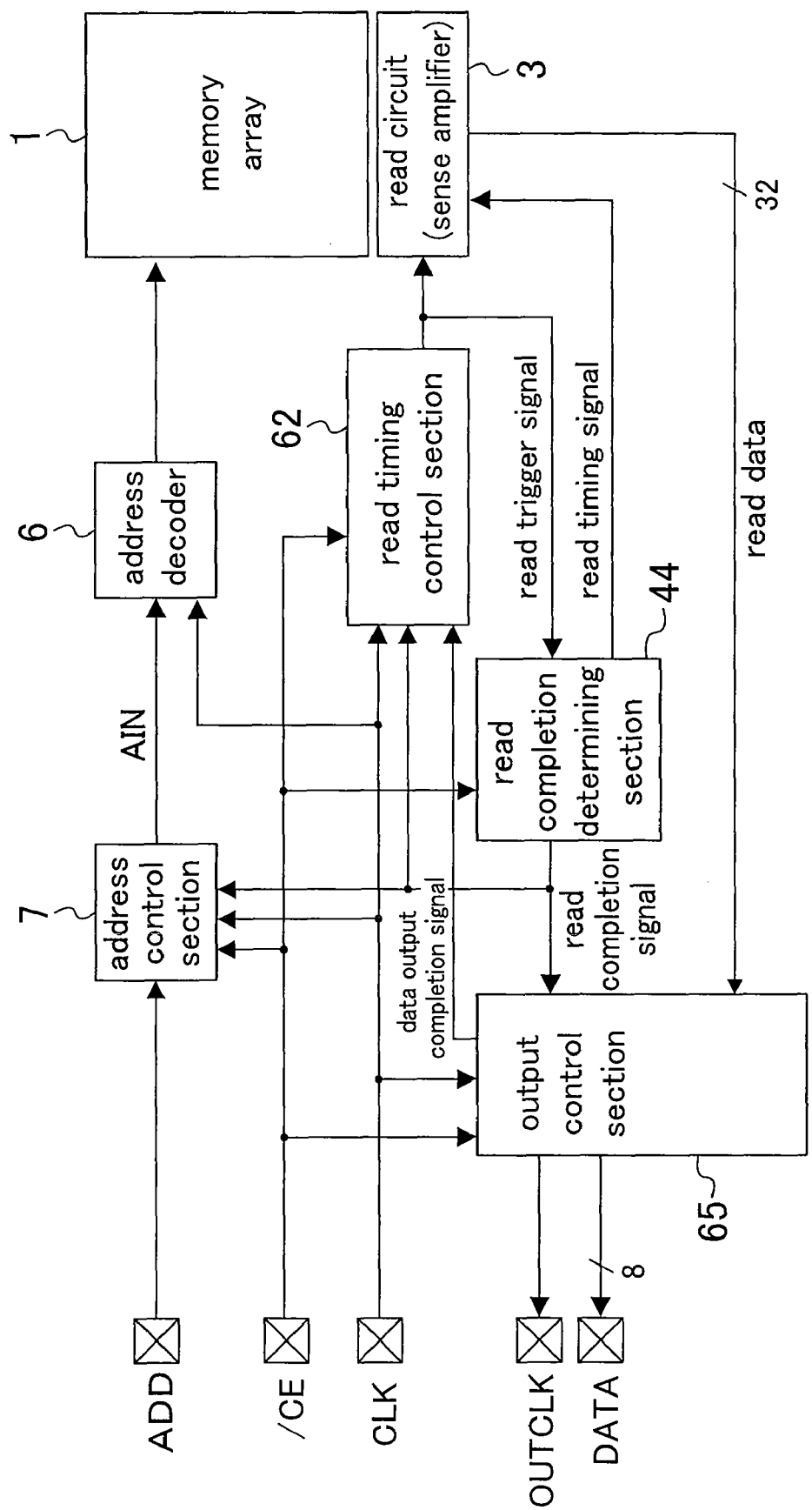
FIG. 6 is a block diagram showing a configuration of a semiconductor memory device according to Embodiment 3.

As shown in FIG. 6, this semiconductor memory device has a configuration different from that of the semiconductor memory device of Embodiment 2 in that a read timing control section 62 and an output control section 65 are provided instead of the read timing control section 42 and the output control section 5.

The read timing control section 62, after reading of read data from the read circuit 3 is completed and then the read completion signal goes to "H", and all data read before that is output from the output control section 65 and then a data output completion signal goes to "H", causes the read trigger signal to go to "H" in synchronization with the rise of CLK so as to read out the next data. Here, the data output completion signal returns to "L" before the rise of CLK as described below. However, for example, based on an output of a flip-flop circuit (not shown) which is set when the data output completion signal goes to "H", the read trigger signal is caused to go to "H".

Figure 7:
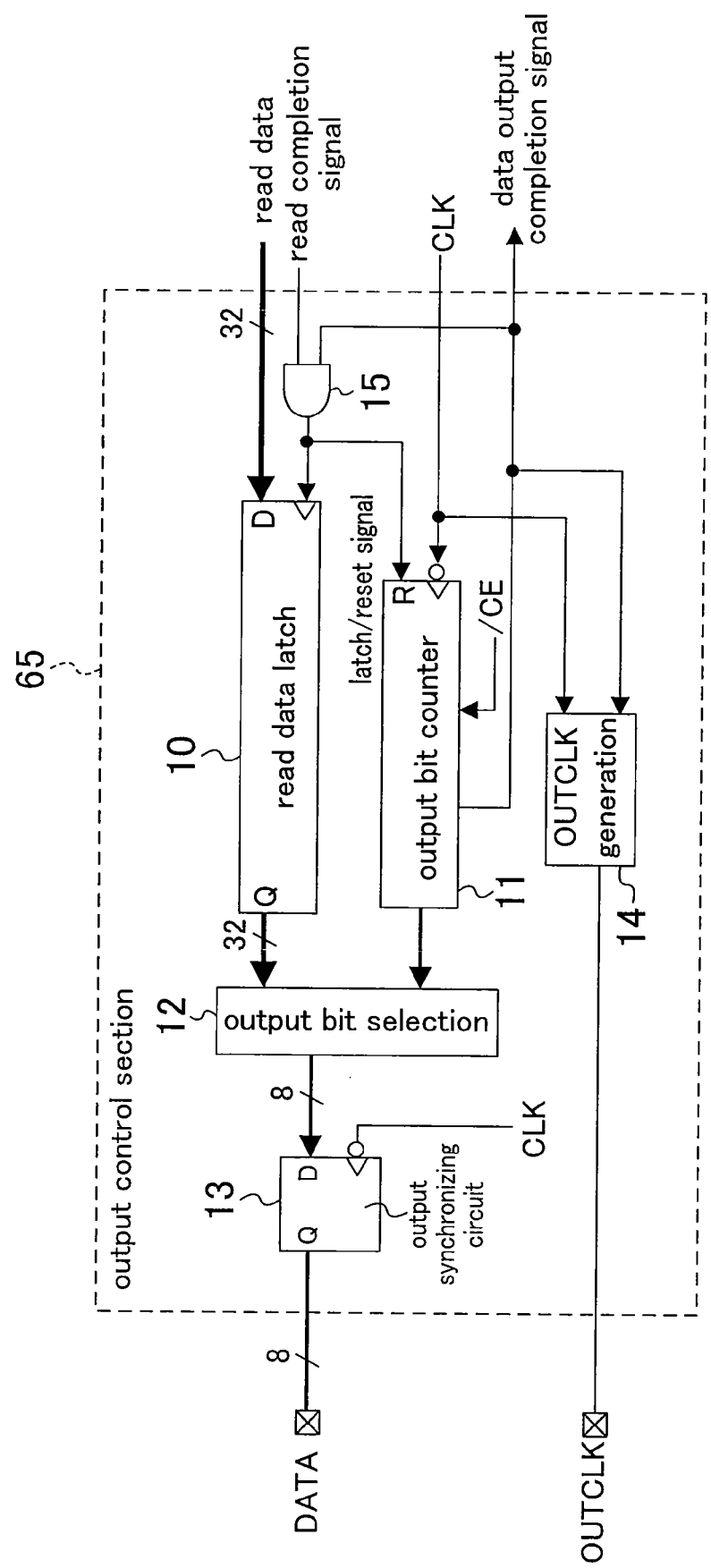
FIG. 7 is a block diagram showing a detailed configuration of an output control section 65 of the semiconductor memory device of Embodiment 3.

The output control section 65 temporarily holds 32-bit read data output from the read circuit, and divides the data into four pieces of 8-bit data, which are in turn separately output through the DATA terminal. Also, when the four output operations are completed, the data output completion signal is output. Specifically, for example, as shown in FIG. 7, the output control section 65 comprises a read data latch 10, an output bit counter 11, an output bit selecting circuit 12, an output synchronizing circuit 13, an OUTCLK generating section 14, and an AND circuit 15.

The AND circuit 15 outputs a latch/reset signal which goes to "H" when both a read completion signal output from the read completion determining section 44 and a data output completion signal output from the output bit counter 11 go to "H", so as to cause the read data latch 10 to hold 32-bit read data output from the read circuit 3, and reset the output bit counter 11.

The output bit counter 11 counts up a count value from 0 to 4 in synchronization with the fall of CLK. When the count value is between "0" to "3", the output bit counter 11 causes the data output completion signal to go to "L", indicating that outputting of the read data held by the read data latch 10 has not been completed. When the count value reaches "4", the output bit counter 11 causes the data output completion signal to go to "H". Note that an initial state and an operation when /CE goes to "H" will be described below.

The output bit selecting circuit 12 selects 8-bit data at a bit position corresponding to a count value output from the output bit counter 11 of the 32-bit read data held by the read data latch 10.

The output synchronizing circuit 13 holds the 8-bit data selected by the output bit selecting circuit 12 at the fall of CLK, and outputs the data as output data DATA.

The OUTCLK generating section 14 outputs the output clock OUTCLK during a time when the data output completion signal is at "L" and until outputting of the read data held by the read data latch 10 is completed after the data output completion signal goes to "H".

Figure 8:
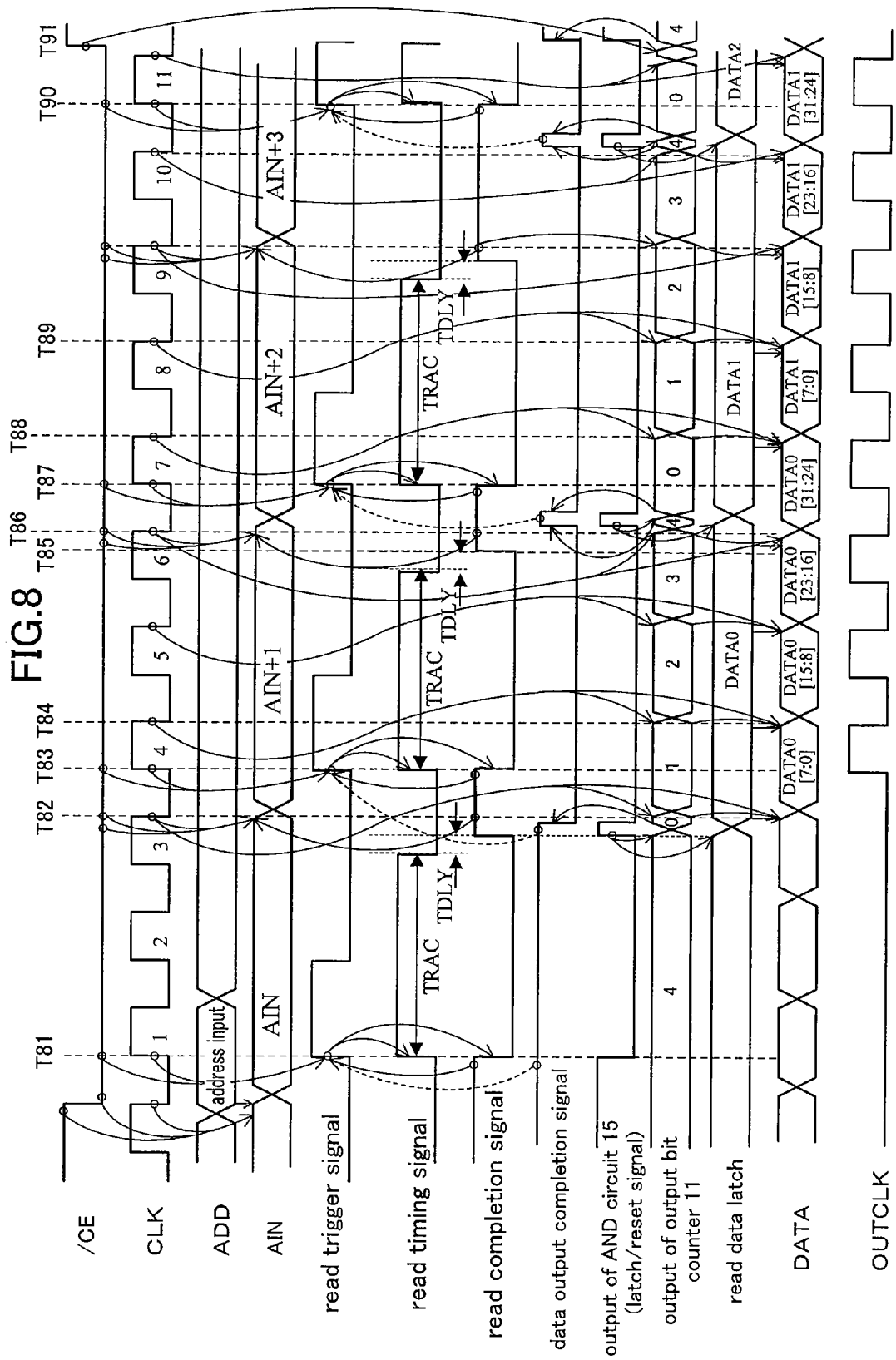
FIG. 8 is a timing chart showing an operation of each part of the semiconductor memory device of Embodiment 3.

An operation of the thus-configured semiconductor memory device will be described with reference to FIG. 8.

Embodiment 3 is the same as Embodiment 2 in that the address control section 7 outputs read addresses AIN, AIN+1, . . . , which are successively incremented, that the read completion determining section 44 outputs the read timing signal and the read completion signal in response to transition to "H" of the read trigger signal, and the read operation of stored data by the read circuit 3.

Specifically, the address control section 7 takes in an externally input read address ADD and outputs the address as the read address AIN in synchronization with the fall of CLK when /CE goes from "H" to "L", and thereafter, every time CLK falls after the read completion signal goes to "H", the successively incremented read addresses AIN, AIN+1, . . . are output (T82, T86, etc.).

The read completion determining section 44 outputs a read timing signal and a read completion signal which are transitioned as in Embodiment 2, depending on a read trigger signal output from the read timing control section 62. The read circuit 3 outputs read data DATA0, DATA1, . . . , depending on the read trigger signal and the read timing signal.

On the other hand, the read timing control section 62 causes the read trigger signal to go to "H" in synchronization with the rise of CLK when /CE is at "L" and the read completion signal is at "H", and in addition, the data output completion signal has been once at "H" after the read trigger signal went to "H" (T81, T83, T87, T90). Specifically, for example, reading of read data DATA2 caused by transition to "H" of the read trigger signal at (T87) is completed near CLK9, so that the read completion signal goes to "H". However, a read trigger signal for the next read goes to "H" at the rise (T90) of CLK11 after outputting of the read data DATA1 is completed and the data output completion signal goes to "H".

Next, an operation of outputting read data by the output control section 65 will be mainly described.

The output control section 65 sets a value of "4" to the output bit counter 11 in the initial state, and outputs a data output completion signal of "H" while counting is stopped. Therefore, the latch/reset signal output from the AND circuit 15 is transitioned in the same manner as that of the read completion signal. Specifically, when the read completion signal goes to "L" at (T81), the latch/reset signal also goes to "L", and when the read completion signal goes to "H" after lapse of the period TRAC+TDLY, the latch/reset signal also goes to "H".

In response to transition to "H" of the latch/reset signal, the read data latch 10 holds the read data DATA0 output from the read circuit 3. The count value of the output bit counter 11 is reset to "0" (therefore, the data output completion signal immediately goes to "L", and the latch/reset signal output from the AND circuit 15 also goes to "L").

When the count value of the output bit counter 11 is reset to "0", the output bit selecting circuit 12 selects 8-bit read data DATA0 [7:0] at a bit position corresponding to the count value "0" of the 32-bit read data DATA0 held by the read data latch 10.

In this case, when the next CLK falls (T82), the thus-selected read data DATA0 [7:0] is held by the output synchronizing circuit 13, and is output as the output data DATA from the DATA output terminal. Also, when the data output completion signal is at "L" as described above, i.e., there is some read data which has been taken in by the read data latch 10 but has not yet been output, the output clock OUTCLK is output from the OUTCLK generating section 14 (T83). Thereafter, similarly, every time CLK falls, the output bit counter 11 counts up, and read data DATA0 [15:8] to [31:24] are successively held and output by the output synchronizing circuit 13 (T84, etc.), and the output clock OUTCLK is output by the OUTCLK generating section 14.

Thereafter, when CLK input to the output bit counter 11 falls at (T86), the count value of the output bit counter 11 becomes "4" with a slight time lag, and the data output completion signal goes to "H". In this case, if the read completion signal is at "H" as in the example of FIG. 8, the latch/reset signal output from the AND circuit 15 also goes to "H", and the read data latch 10 holds the next read data DATA1 output from the read circuit 3 as is similar to the case of the above-described timing near (82). Also, the count value of the output bit counter 11 is reset to "0".

Note that, if the read completion signal is not at "H" when the count value of the output bit counter 11 reaches "4", the latch/reset signal remains at "L" and the counting operation of the output bit counter 11 is stopped. In this case, when the read completion signal goes to "H", the same operation as that described above is performed.

Also, when /CE goes to "H" so that the read operation is stopped (T91), the read timing control section 62 causes the read trigger signal to return to "L" and the read completion determining section 44 causes the read timing signal and the read completion signal to return to "L" and "H", respectively, while a value of "4" is set to the output bit counter 11 of the output control section 65, whereby the data output completion signal goes to "H", so that the counting cooperation is stopped and the outputting of read data and an output clock is also stopped, as described in Embodiment 2.

As described above, no matter whether the read operation of the read circuit 3 or the output operation of the output control section 65 precedes, the next read operation or output operation is controlled based on both the read completion signal and the data output completion signal, i.e., timing of transition to "H" of the read trigger signal, latch of read data by the read data latch 10, reset of the output bit counter 11, and the like are controlled, thereby making it possible to easily perform read reliably and efficiently.

Although it has been described in the example above that 32-bit read data is read out from the memory array 1 and 8-bit output data DATA is output four times, the present invention is not limited to this. Various bit numbers can be easily combined.

Variation of Embodiment 3 of the Invention

Figure 9:
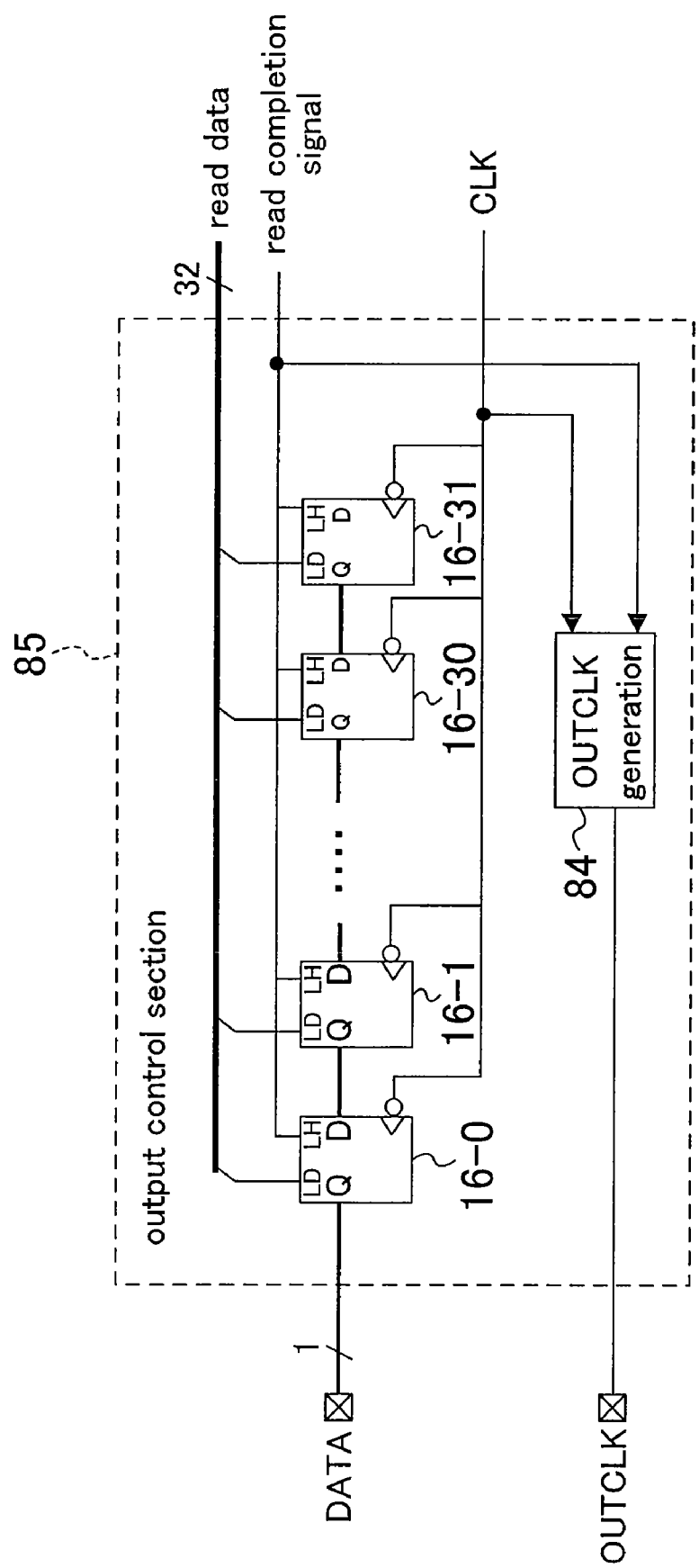
FIG. 9 is a block diagram showing a detailed configuration of an output control section 85 according to a variation of Embodiment 3.

Instead of the output control section 65 as described above, an output control section 85 as shown in FIG. 9 may be used. In FIG. 9, flip-flop circuits 16-0 to 16-31, which constitute a shift register, holds 32-bit read data in response to transition to "H" of the read completion signal, and outputs one bit of output data DATA while successively shifting the value of each bit every time CLK falls. An OUTCLK generating section 84 outputs an output clock OUTCLK 32 times every time the read completion signal goes to "H". Note that a data output completion signal similar to that of Embodiment 3 may be output in response to timing of output completion.

With the above-described configuration, one bit of output data DATA is particularly easily output. The present invention is not limited to this. For example, eight 4-bit shift registers may be provided, and 8-bit output data may be output four times as described in Embodiment 3.

Also, a larger number of flip-flop circuits may be provided, and the next read data may be held even when outputting of output data has not been completed.

Embodiment 4 of the Invention

As a semiconductor memory device according to Embodiment 4, an exemplary semiconductor memory device will be described in which, as is converse to Embodiment 3, the bit width of data output through the DATA terminal is larger than the data bit width of data read output from the read circuit. In this exemplary semiconductor memory device, two pieces of 8-bit data separately read out from the read circuit are output together as 16-bit data through the DATA terminal.

Figure 10:
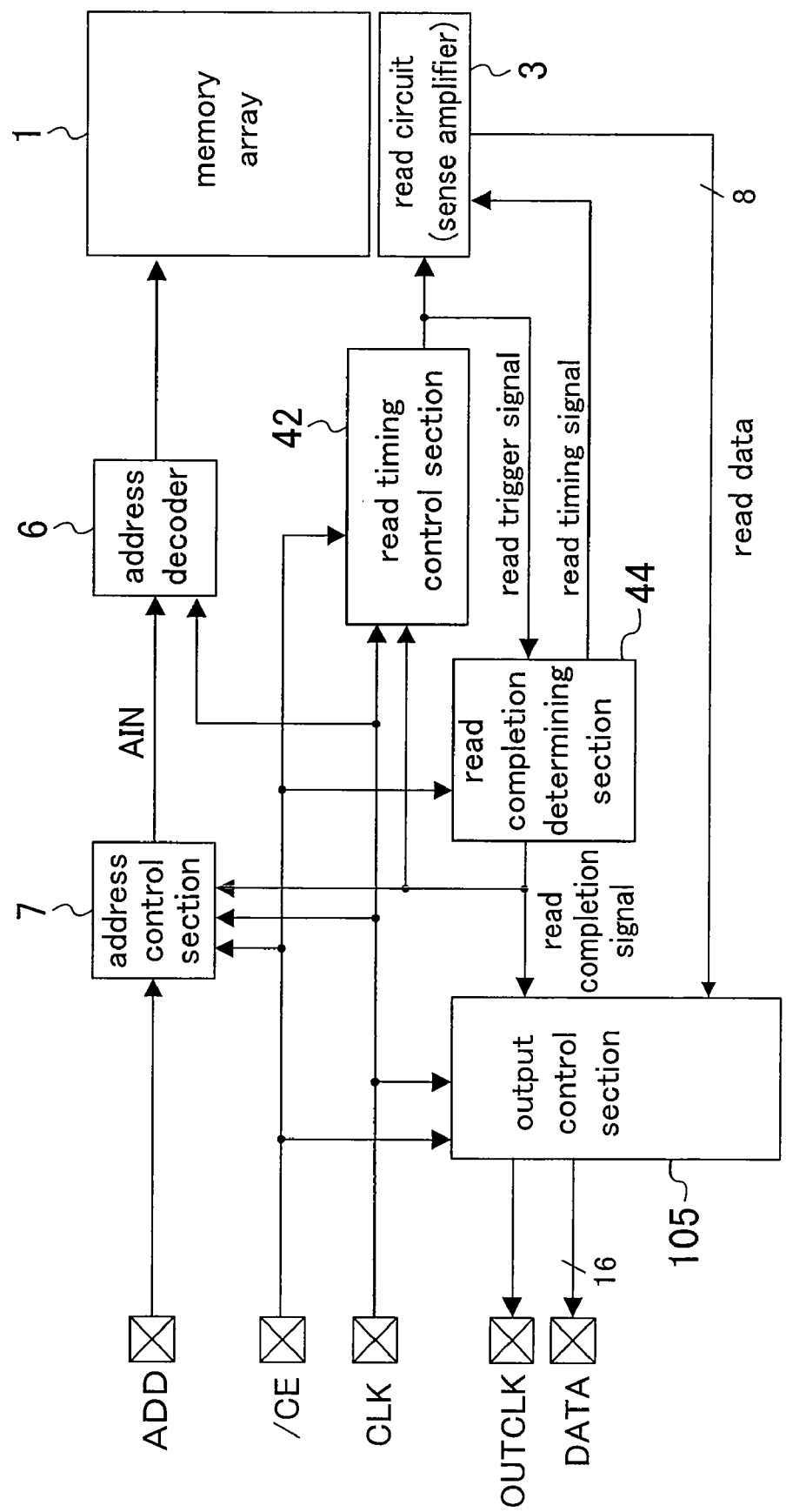
FIG. 10 is a block diagram showing a configuration of a semiconductor memory device according to Embodiment 4.

This semiconductor memory device has a configuration different from that of the semiconductor memory device of Embodiment 2 in that an output control section 105 is provided instead of the output control section 5 as shown in FIG. 10.

Figure 11:
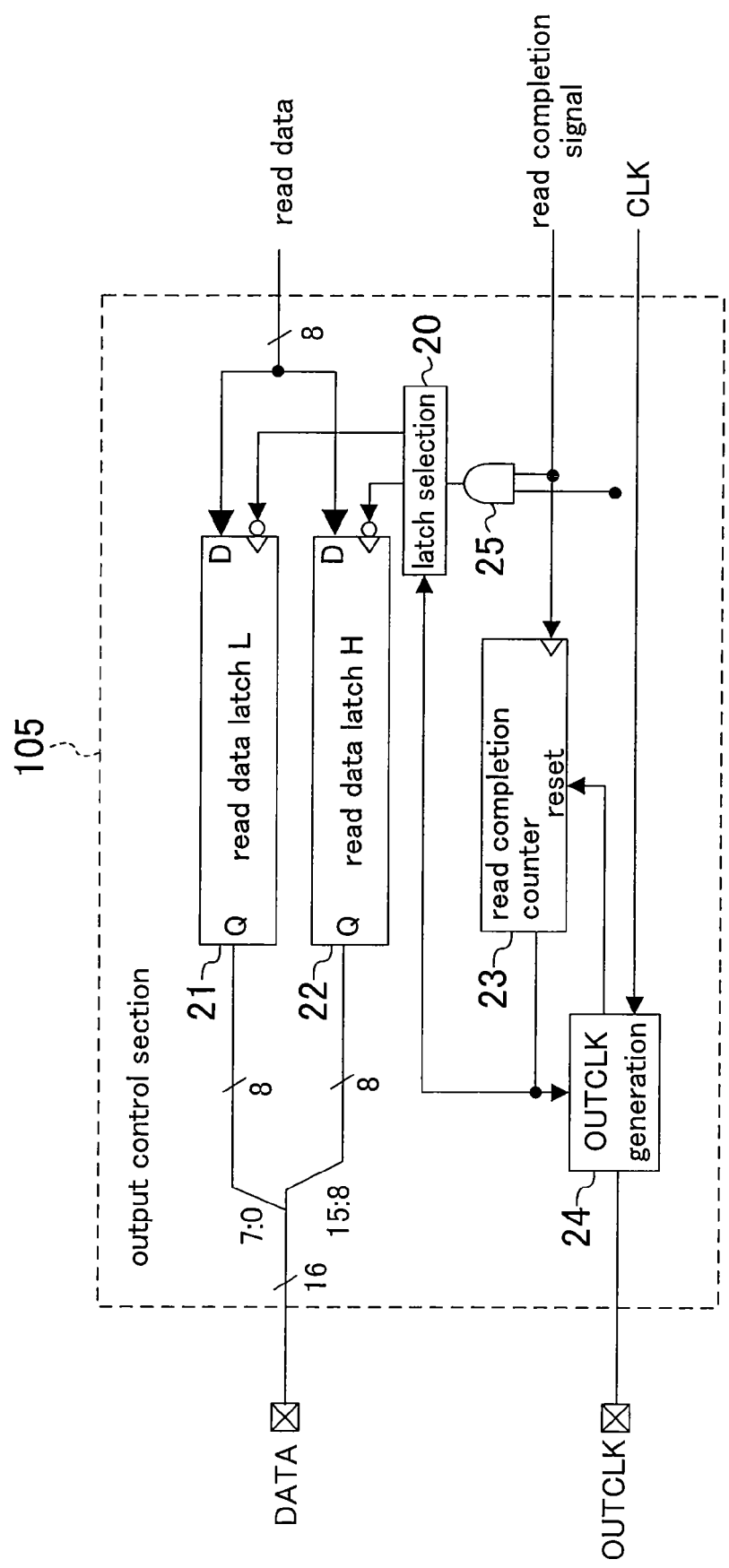
FIG. 11 is a block diagram showing a detailed configuration of an output control section 105 of the semiconductor memory device according to Embodiment 4.

The output control section 105 temporarily holds two pieces of 8-bit read data read out from the read circuit, and combines and outputs the two pieces of data as 16-bit output data DATA through the DATA terminal. Specifically, for example, the output control section 105 comprises a latch selecting circuit 20, a read data latch L 21, a read data latch H 22, a read completion counter 23, an OUTCLK generating section 24, and an AND circuit 25 as shown in FIG. 11.

The latch selecting circuit 20 selects a data latch which is to take in the read data output from the read circuit 3.

The read data latch L 21 and the read data latch H 22 are connected to an upper bit and a lower bit of the DATA terminal, respectively.

The read completion counter 23 counts the number of times that the read completion signal goes to "H".

The OUTCLK generating section 24 generates an output clock OUTCLK from an input clock and an output of the read completion counter 23. More specifically, when the output of the read completion counter 23 reaches a predetermined value (2 in Embodiment 4), the output clock OUTCLK is output once, and a reset signal is output to the read completion counter 23.

The AND circuit 25 outputs CLK when the read completion signal is at "H".

Figure 12:
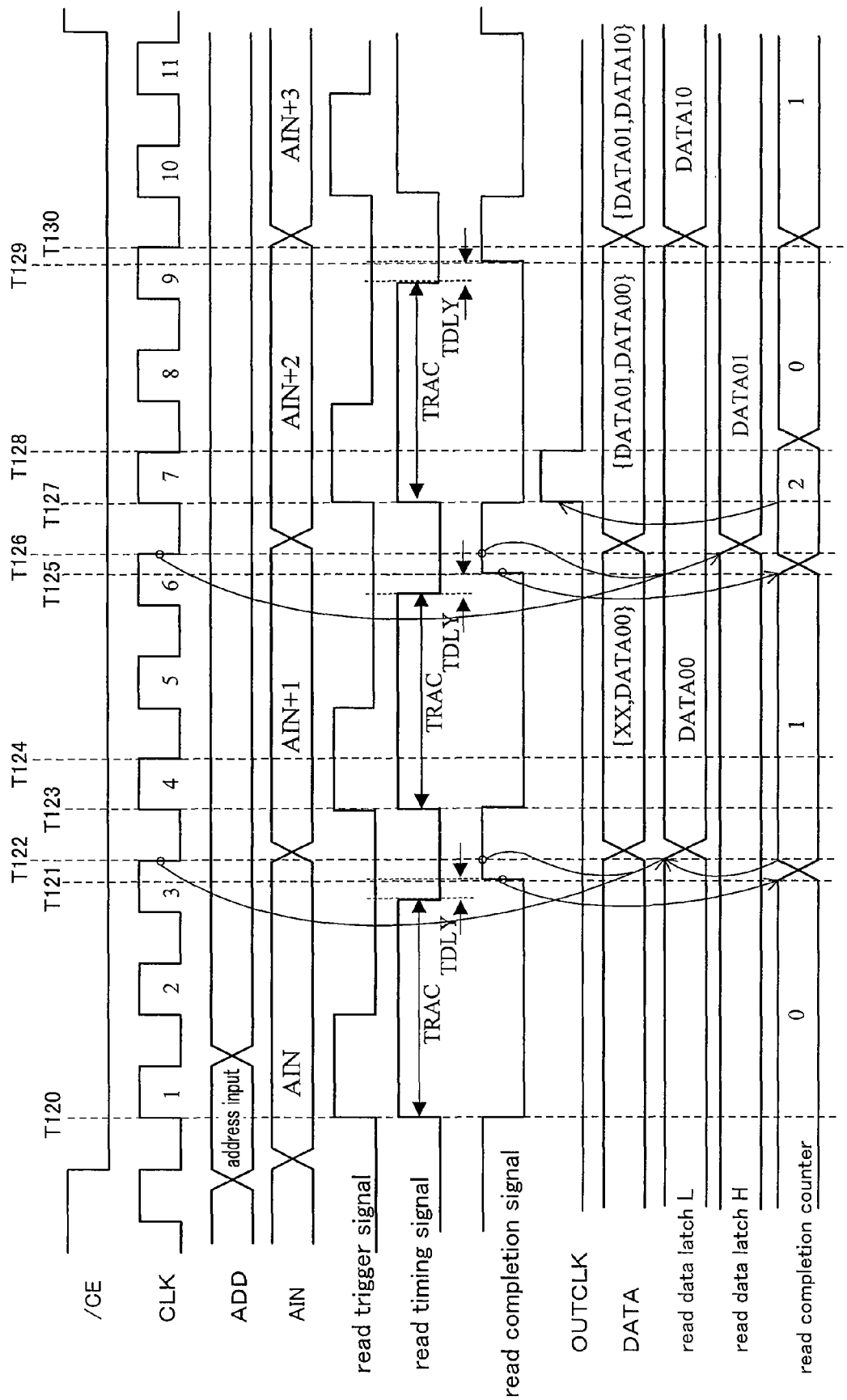
FIG. 12 is a timing chart showing an operation of each part of the semiconductor memory device of Embodiment 4.

An operation of the thus-configured semiconductor memory device will be described with reference to FIG. 12.

Embodiment 4 is the same as Embodiment 2 in that the address control section 7 outputs read addresses AIN, AIN+1, . . . , which are successively incremented, that the read timing control section 42 causes the read trigger signal to go to "H" in synchronization with the rise of CLK, that the read completion determining section 44 outputs the read timing signal and the read completion signal in response to transition to "H" of the read trigger signal, and the read operation of stored data by the read circuit 3.

The read completion counter 23 of the output control section 105 is reset in the initial state, and when read data at the read address AIN is read out and the read completion signal rises, counts up and outputs a count value of "1" (T121). In this case, at the fall of the next CLK, the read data output from the read circuit 3 is latched by the read data latch L 21 (T122). Specifically, at this time point, the DATA terminal is in a state in which the upper bit is invalid data and the lower bit is DATA00, i.e., not all bits have not yet been prepared.

Thereafter, when read data at the next address AIN+1 is read out and the read completion signal goes to "H" again, the read completion counter 23 further counts up and outputs a count value of "2" (T125). In this case, at the fall of the next CLK, the read data output from the read circuit 3 is latched by the read data latch H 22 (T126). At this time point, the DATA terminal has DATA01 in the upper bit and DATA00 in the lower bit, i.e., data of all bits is prepared.

On the other hand, in the OUTCLK generating section 24, it is determined the count value of the read completion counter 23 is equal to a predetermined number ("2"). Since they are equal to each other, OUTCLK goes to "H" at the rise of the next CLK, and goes to "L" at the fall of the next CLK. In this case, the read completion counter 23 is reset at the same time.

Thereinafter, a similar operation is repeatedly performed until /CE goes to "H".

As described above, when the output data bit width of the DATA terminal is larger than the read data bit width of the read circuit 3, an output clock OUTCLK can be output while valid output data is output through the DATA terminal. Therefore, the output data bit width can be easily increased without increasing the number of sense amplifiers in the read circuit 3.

Note that the read data and the output data are not limited to 8 bits and 16 bits, and various bit widths can be easily combined.

Embodiment 5 of the Invention

As a semiconductor memory device of Embodiment 5, an exemplary semiconductor memory device will be described in which transition timings of a read timing signal and a read completion signal are automatically controlled. Specifically, for example, such a control is performed based on dummy data actually read out.

Figure 13:
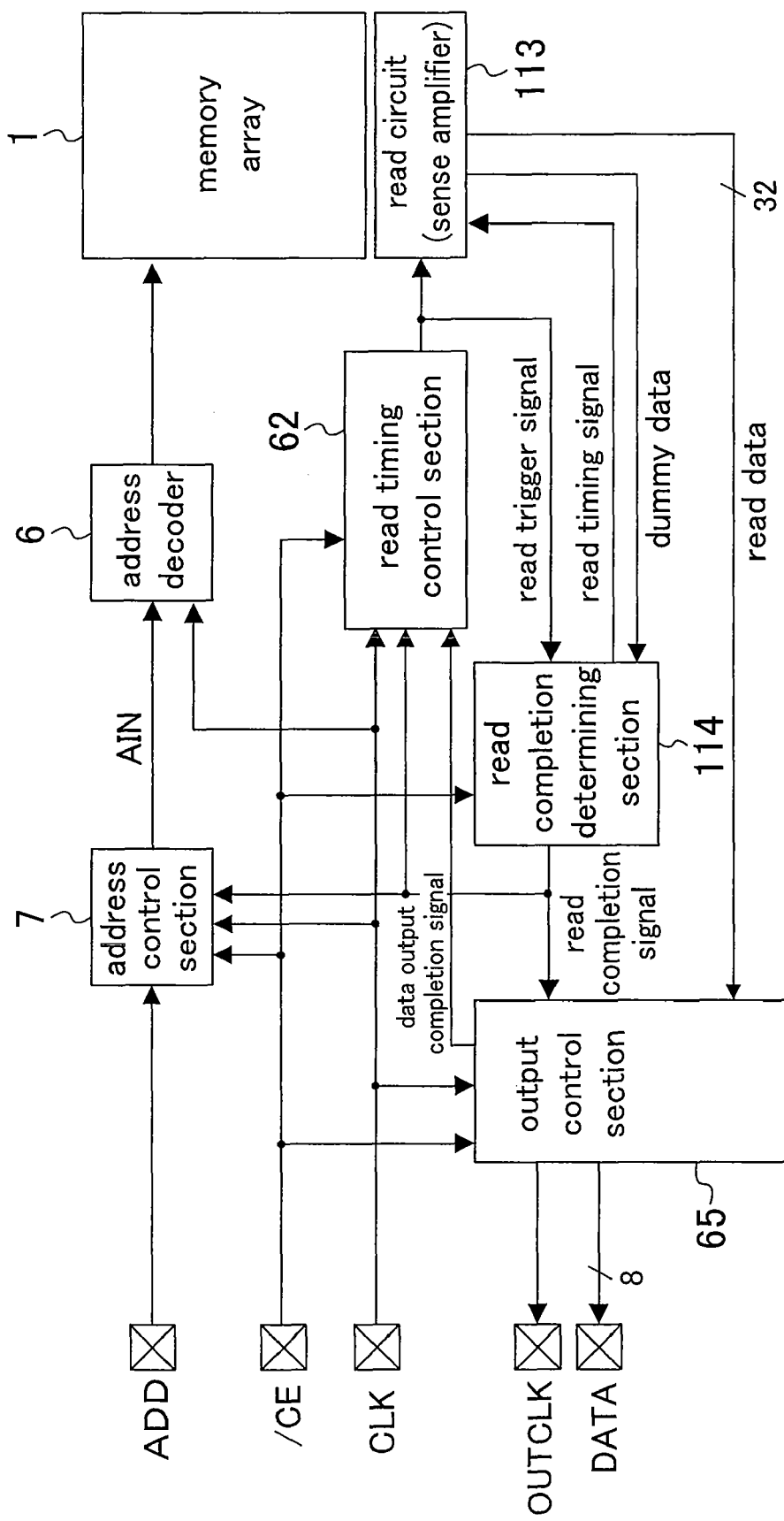
FIG. 13 is a block diagram showing a configuration of a semiconductor memory device according to Embodiment 5.

This semiconductor memory device has a configuration different from that of the semiconductor memory device of Embodiment 3 in that a read circuit 113 and a read completion determining section 114 are provided instead of the read circuit 3 and the read completion determining section 44 as shown in FIG. 13.

The read circuit 113 outputs, for example, 32-bit read data, and in addition, dummy data having a known value.

The read completion determining section 114 detects a time required to actually read out stored data based on the dummy data so as to control the read timing signal and the read completion signal.

Figure 14:
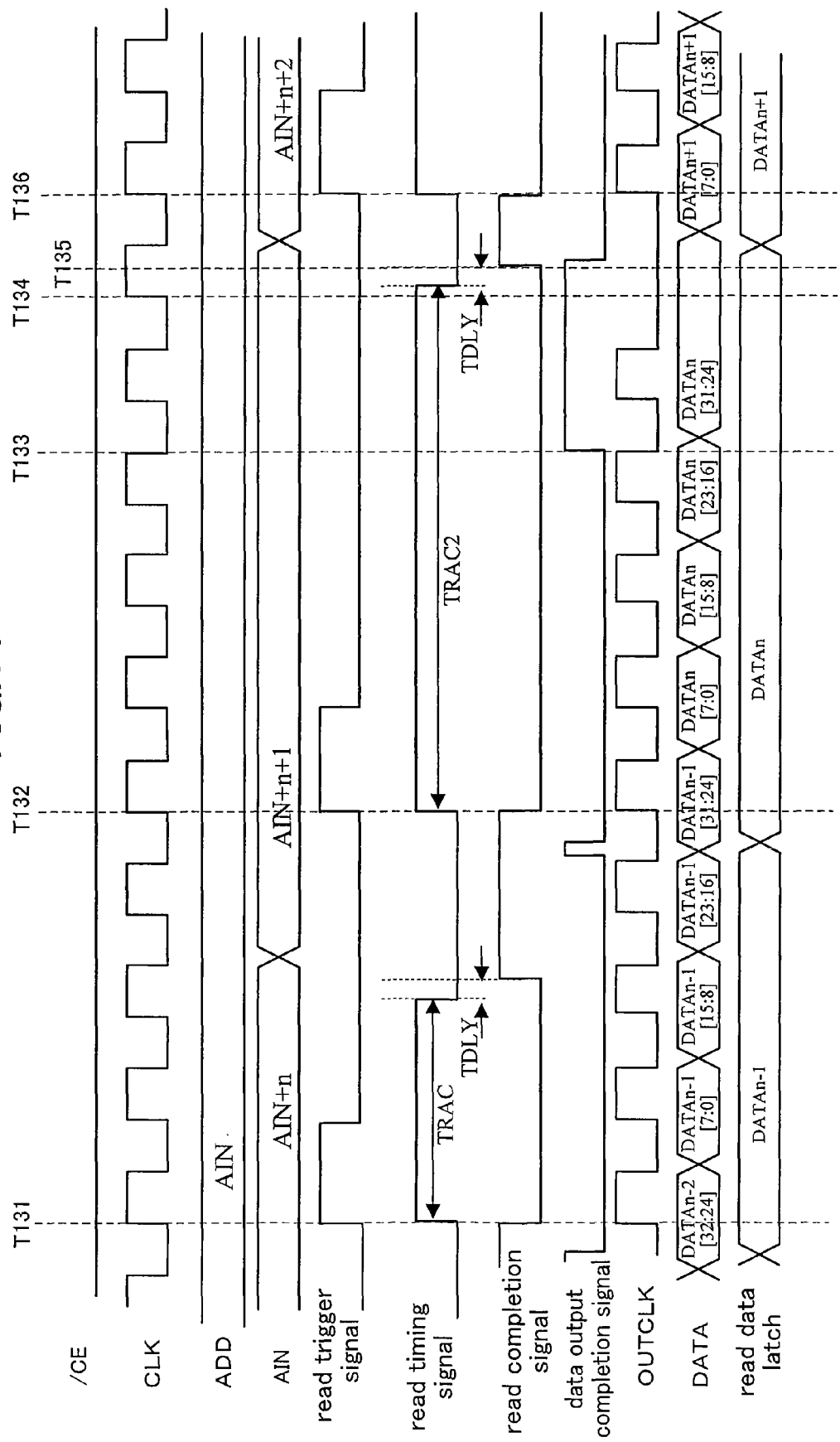
FIG. 14 is a timing chart showing an operation of each part of the semiconductor memory device of Embodiment 5.

An operation of the thus-configured semiconductor memory device is the same as that of Embodiment 3, except that a period TRAC for which the read timing signal is at "H" and a period TRAC+TDLY for which the read completion signal is at "L" dynamically vary, as shown in, for example, FIG. 14. Specifically, as in Embodiment 3, the output control section 65 is controlled in accordance with a read completion signal output by the read completion determining section 114, and the read timing control section 62 is controlled in accordance with a data output completion signal output by the output control section 65, thereby making it possible to easily control critical timing, i.e., outputting of data with earliest timing, depending on a variation in conditions during manufacture, a variation in conditions during use, or the like. Thereby, reliable and efficient read can be easily performed.

Note that a time required to read stored data as described above may not be directly detected. A similar timing control may be performed based on indirect detection of temperature, a power supply voltage or the like.

When the output control section 65 or the like is controlled using dummy data as described above, the bit width of data read out by the read circuit 3 may not be different from the bit width of data output through the DATA terminal, or alternatively, these bit widths may be equal to each other as in Embodiment 2.

Embodiment 6 of the Invention

Figure 15:
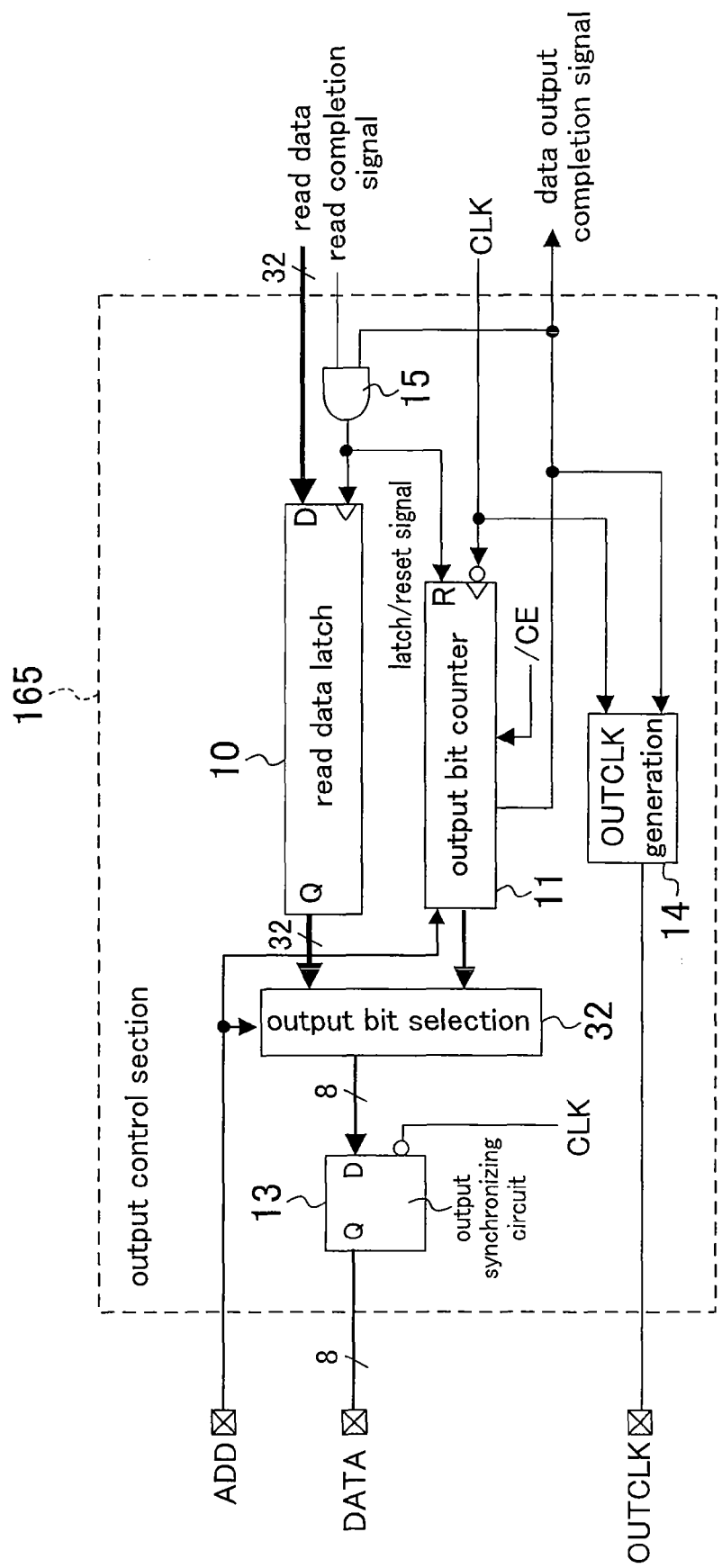
FIG. 15 is a block diagram showing a detailed configuration of an output control section 165 of a semiconductor memory device according to Embodiment 6.
Figure 16:
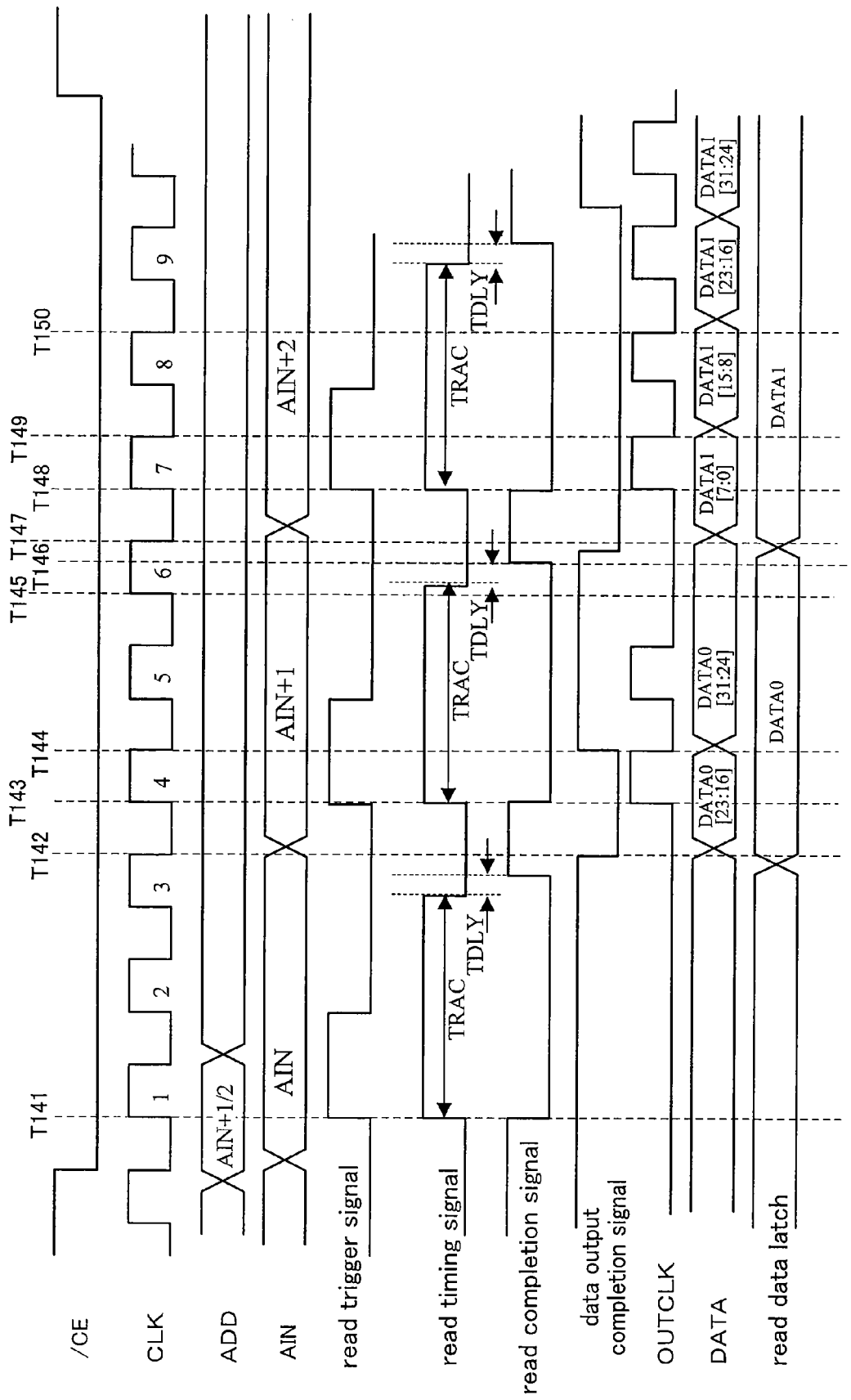
FIG. 16 is a timing chart showing an operation of each part of the semiconductor memory device of Embodiment 6.

Instead of the output control section 65 of Embodiment 3, an output control section 165 comprising an output bit selecting circuit 32 as shown in FIG. 15 may be used so that a bit position to be first output can be changed. An input address is input through the ADD terminal to the output bit selecting circuit 32. A lower bit (e.g., lower two bits) of the input address is preset as an initial value of the output bit counter 11. Specifically, as shown in FIG. 16, if an address taken in with timing of (T141) is AIN+½ which is an address obtained by adding a value corresponding to half a word to a read address AIN, data which is first output is an intermediate bit, but not the head bit of read data. More specifically, outputting is started from DATA0 [23:16] of DATA0 latched by a read data latch with timing of (T 142).

In this case, although the data output completion signal goes to "H" with timing of (T144) at which data has been output twice, since the read completion signal is at "L", data is not immediately latched, and the data output completion signal remains at "H". In this case, OUTCLK does not go to "H" at the rise (T145) of the next CLK.

When the read completion signal subsequently goes to "H", the next read data is latched by the read data latch 10, and OUTCLK is output again from the rise (T148) of the next CLK after the data output completion signal goes to "L".

As described above, for example, even when read is started from a half-word boundary, OUTCLK outputting is controlled (stopped) so that invalid data read or double read of the same data does not occur in a host apparatus.

Embodiment 7 of the Invention

An exemplary host apparatus for reading out stored data from a semiconductor memory device as described in each of the above-described embodiments will be described. Note that the semiconductor memory device and such a host apparatus may be integrally provided on an integrated circuit or may be formed as separate integrated circuits.

Figure 17:
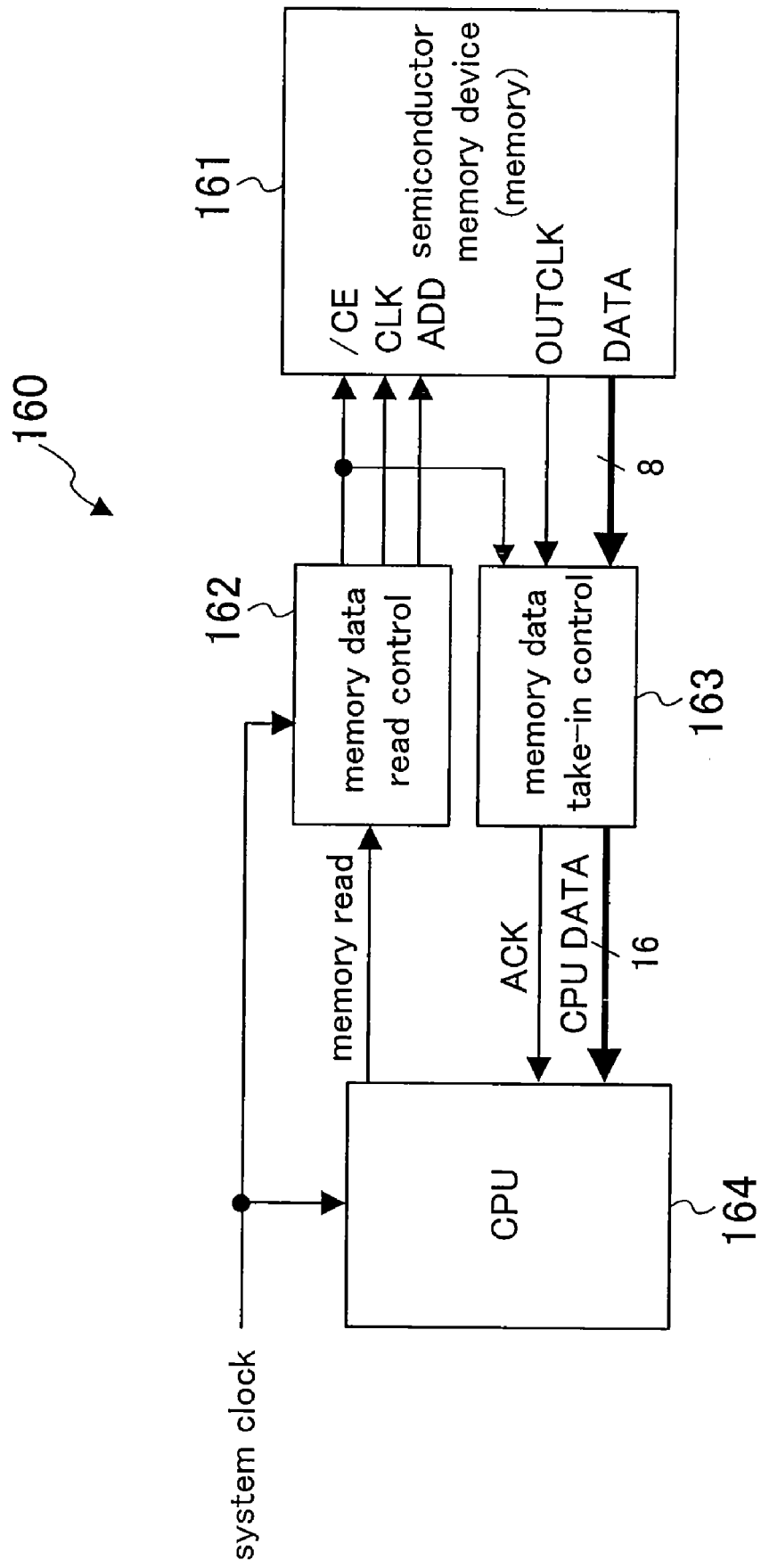
FIG. 17 is a block diagram showing a configuration of a semiconductor memory device according to Embodiment 7.

FIG. 17 is a block diagram showing a configuration of a major portion of a system including a memory 161 which is a semiconductor memory device as described in each embodiment above, and a host apparatus 160.

The host apparatus 160 comprises a CPU 164, a memory data read control section 162 for controlling a signal which is used for the CPU 164 to read out data stored in the memory 161, and a memory data take-in control section 163 for performing a control so that the CPU 164 can read out data based on DATA and OUTCLK output by the memory 161. It is here assumed that the DATA output width of the memory 161 is 8 bits and the data bus width of the CPU 164 is 16 bits.

Figure 18:
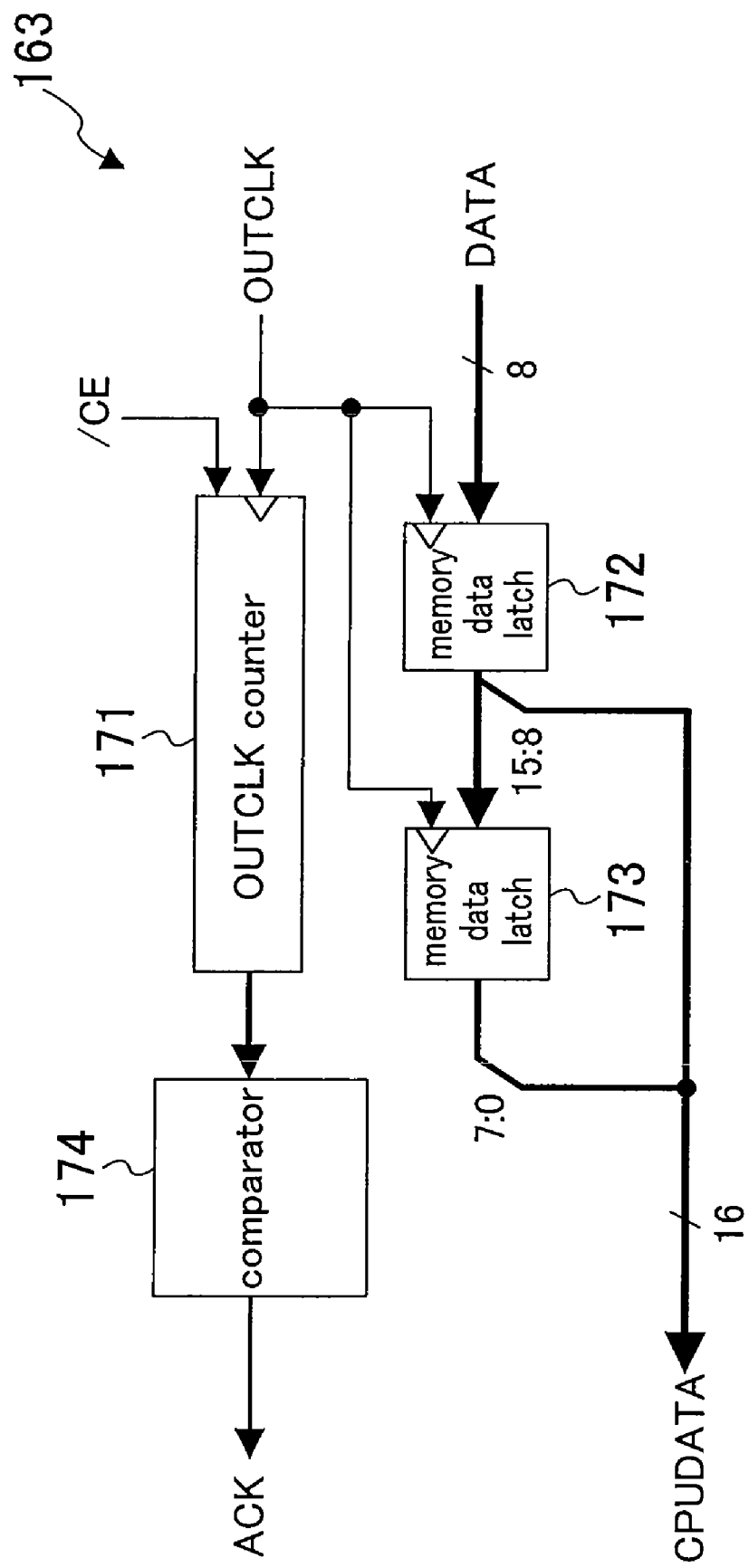
FIG. 18 is a block diagram showing a detailed configuration of a memory data take-in control section 163 of the semiconductor memory device of Embodiment 7.

Specifically, for example, as shown in FIG. 18, the control section 163 comprises an OUTCLK counter 171 for counting OUTCLK, a memory data latch 172 for latching DATA at the rise of OUTCLK, a memory data latch 173 for latching output data of the memory data latch 172 at the rise of OUTCLK, and a comparator 174 for comparing the value of the OUTCLK counter with an expected value (e.g., 2), and when these two values are equal to each other, causing an ACK signal to go to "H". The ACK signal is used so as to enable handshake access.

An operation of the thus-configured system will be described with reference to FIG. 19.

In order to read data from the memory 161, the CPU 164 initially causes the memory data read control section 162 to generate /CE (chip enable), CLK (access clock) and ADD (read address) signals, and to output the signals to the memory 161 so as to access the memory 161. In this case, the OUTCLK counter 171 of the control section 163 is reset to "0" at the fall of /CE.

The memory 161 outputs head data DATA0 with timing of (T180) and causes OUTCLK to go to "H" with timing of (T181) as described in each embodiment.

In this case, DATA output from the memory 161 is latched by the memory data latch 172 in the memory data take-in control section 163 at the rise of OUTCLK. In this case, the OUTCLK counter 171 counts up a count value to "1". The comparator 174 compares the count value with the expected value. Since these values are not equal to each other, the ACK signal remains at "L".

Next, the next data DATA1 is output from the memory 161. Data in the memory data latch 172 is taken in by the memory data latch 173 at the rise of OUTCLK output with timing of (T182). DATA1 output from the memory is taken in by the memory data latch 172.

In this case, the count value of the OUTCLK counter 171 is counted up to "2". In this case, since the count value and the expected value are equal to each other, the comparator 174 causes the ACK signal to go to "H". In this case, the CPU 164 takes in CPU DATA with timing of (T183), i.e., the rise of the next CLK after the ACK signal goes to "H".

When read is completed, the memory data read control section 162 causes /CE to go to "H" and ends access to the memory.

As described above, even when the data bus width of the CPU is different from the output data width of the memory, desired memory data can be easily correctly read out without requiring a special control in the CPU. Note that bit width conversion may not be necessarily performed. Even in this case, correct read can be easily achieved.

Figure 19:
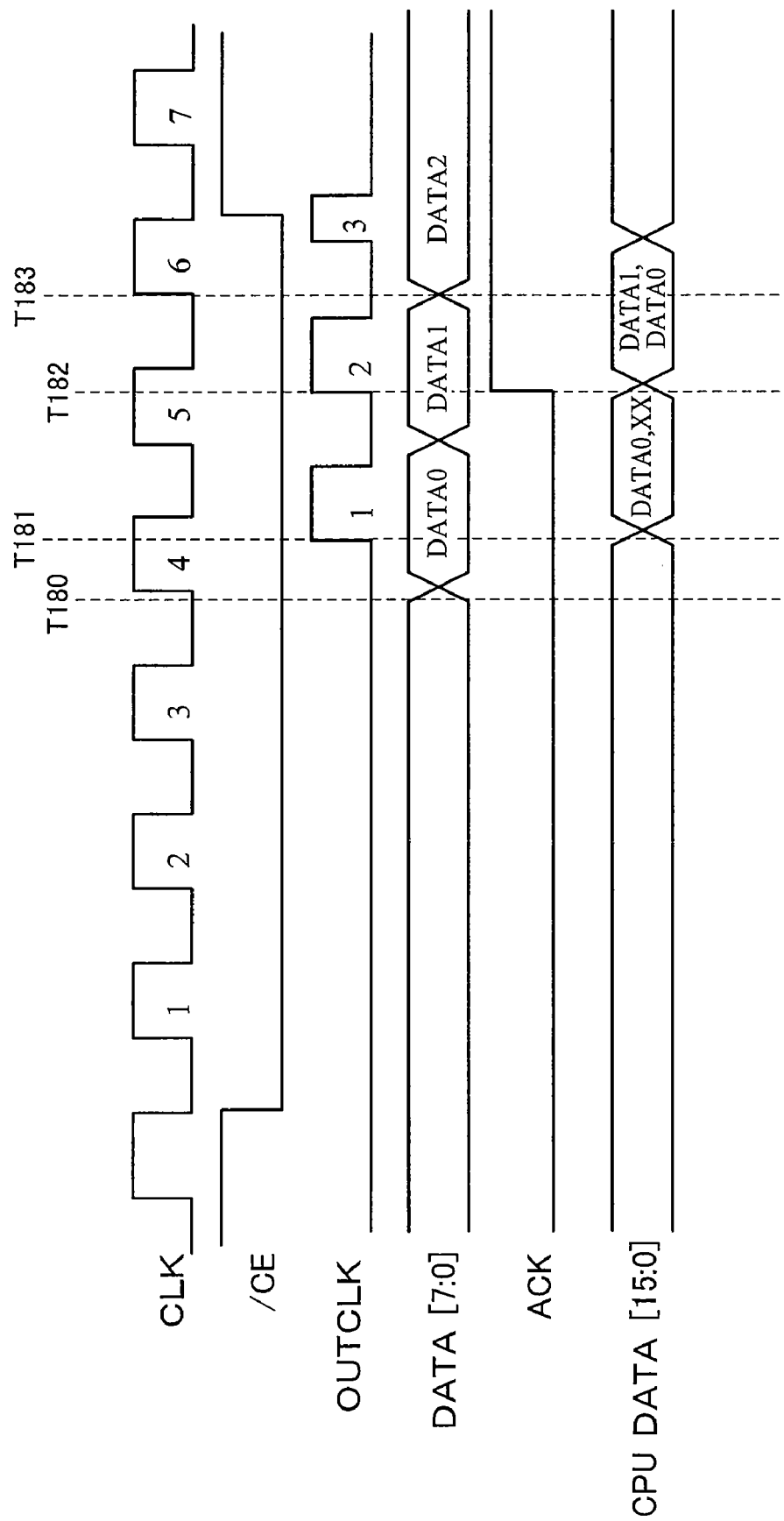
FIG. 19 is a timing chart showing an operation of each part of the semiconductor memory device of Embodiment 7.
Figure 20:
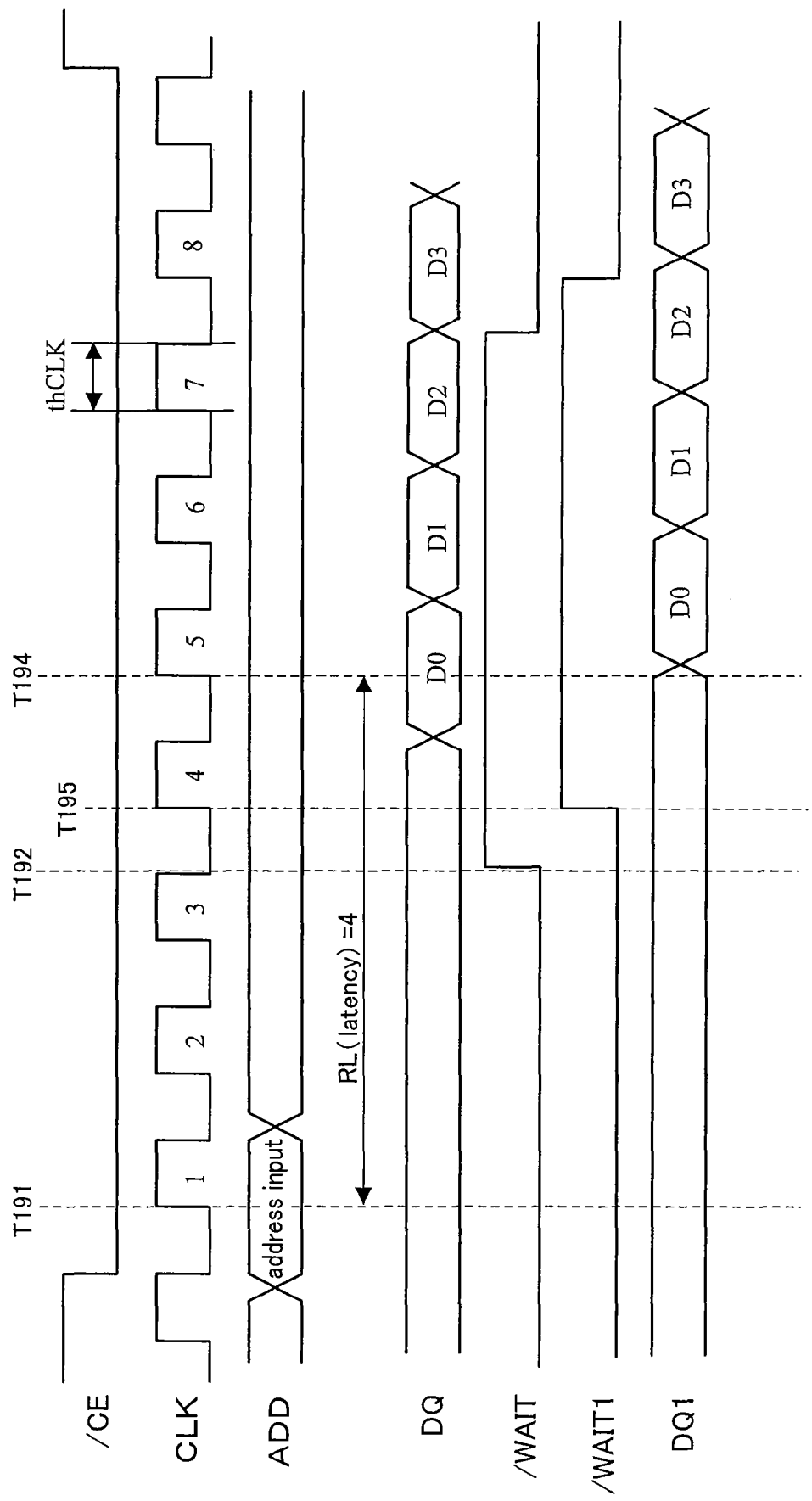
FIG. 20 is a timing chart showing an operation of a conventional semiconductor memory device.

Also, for example, if there is a large signal delay between the CPU and the memory as shown in FIG. 19, then when data is to be read out at the rise of CLK4 where the latency=4, the large data delay highly likely leads to erroneous read. In contrast, if data is taken in at the rise of OUTCLK as described above, stable data read can be easily achieved.

Therefore, it is not necessary to increase drive performance or extremely reduce a wiring length so as to prevent a signal delay, so that a system having a high degree of freedom can be easily constructed.

Although it has been described in the first to sixth embodiments that, in the semiconductor memory device, the address terminal and the data terminal are separate terminals, the present invention is similarly applicable even when addresses and data are input and output through the same terminal serially or the like. Thus, if addresses and data are serially input, data is serially output, and a terminal is shared, then particularly when an operation is performed with a high clock frequency, data throughput can be easily improved with a smaller number of terminals, which is a significant effect.

The configurations described in the embodiments and the variations above may be variously combined as long as the resultant combination is logically possible. Specifically, for example, even when data at one address is read out as in Embodiment 1, bit width conversion or the like may be performed as in Embodiments 3 to 6, or alternatively, the functions of the embodiments may be all possessed and switched in use.

A device to which the above-described configuration is applied is not particularly limited, and, for example, is useful as a code storing memory or a data storing memory for various systems. Also, for example, since a signal delay can be easily ignored, the present invention is suitable to a memory provided in a large-scale system LSI (SOC: System on Chip), or an SiP (System in Package) including a system LSI and a memory. Also, the present invention is suitable to serial access where the number of terminals is small, and therefore, is also applicable to various kinds of memory cards, an USB memory, and the like.

INDUSTRIAL APPLICABILITY

According to the semiconductor memory device of the present invention, data can be easily read out with earliest timing, erroneous read can be easily prevented, and the like. The semiconductor memory device of the present invention is useful as, for example, a clock-synchronization type semiconductor memory device, an integrated circuit including this, and a system (semiconductor device) employing this, a stored data reading device, and the like.

The invention claimed is:

1. A semiconductor memory device comprising:
    an address terminal through which an address for reading out stored data in a memory array is input;
    a clock input terminal through which an input clock is input;
    a data output terminal through which data read out from the memory array in accordance with the address is output; and
    a clock output terminal through which an output clock synchronous with the input clock is output,
    wherein the clock output terminal invariably outputs one of a first voltage and a second voltage, and
    only when valid data is output from the data output terminal, the clock output terminal causes an output voltage to go from the first voltage to the second voltage or from one voltage to the other voltage.

2. The semiconductor memory device of claim 1, wherein transition of the output voltage at the clock output terminal is performed with timing which depends on a time from the start to the end of read of data from the memory array and does not depend on an input clock number counted from the start of the read.

3. The semiconductor memory device of claim 2, wherein the time from the start to the end of read of data from the memory array is previously set.

4. The semiconductor memory device of claim 2, wherein the time from the start to the end of read of data from the memory array is detected based on an environment state.

5. The semiconductor memory device of claim 2, wherein the time from the start to the end of read of data from the memory array is detected based on a read operation of dummy data.

6. The semiconductor memory device of claim 1, wherein the address terminal and the data output terminal are a common terminal.

7. The semiconductor memory device of claim 1, wherein the data output terminal outputs data read out from successive addresses whose initial value is an input address.

8. The semiconductor memory device of claim 7, wherein a piece of data read out from the memory array is divided into a plurality of portions, which are in turn separately output through the data output terminal.

9. The semiconductor memory device of claim 7, wherein the data output terminal simultaneously outputs a plurality of pieces of data read out from the memory array.

10. A semiconductor memory device comprising:
    a data output terminal for outputting data read out from a memory array in accordance with an externally input address; and
    a clock output terminal through which an output clock synchronous with an externally input clock is output, wherein the clock output terminal causes an output voltage to go from a first voltage to a second voltage or from one voltage to the other voltage only when valid data is output from the data output terminal, with timing which depends on a time from the start to the end of read of data from the memory array and does not depend on an input clock number counted from the start of the read.

11. A stored data reading device, wherein, based on data and an output clock output from the semiconductor memory device of claim 1, data stored in the semiconductor memory device is read out.

12. The stored data reading device of claim 11, wherein a predetermined number of pieces of data read out from the semiconductor memory device are combined and simultaneously output to a data processing section.

13. A semiconductor device comprising the semiconductor memory device of claim 1 and the stored data reading device of claim 11.

* * * * *